(12) United States Patent
Nagai et al.

(10) Patent No.: US 6,791,894 B2
(45) Date of Patent: Sep. 14, 2004

(54) DRAM POWER-SOURCE CONTROLLER THAT REDUCES CURRENT CONSUMPTION DURING STANDBY

(75) Inventors: Wataru Nagai, Tokyo (JP); Akihiro Hirota, Tokyo (JP); Junichi Suyama, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/252,102

(22) Filed: Sep. 23, 2002

(65) Prior Publication Data
US 2003/0151967 A1 Aug. 14, 2003

(30) Foreign Application Priority Data
Feb. 14, 2002 (JP) ........................................ 2002-036262

(51) Int. Cl.[7] .............................................. G11C 7/00
(52) U.S. Cl. ....................... 365/226; 365/227; 365/229; 365/189.09
(58) Field of Search ................................ 365/226, 227, 365/228, 229, 189.09, 194

(56) References Cited

U.S. PATENT DOCUMENTS

| | | | | |
|---|---|---|---|---|
| 5,659,517 A | * | 8/1997 | Arimoto et al. | 365/226 |
| 5,724,297 A | * | 3/1998 | Noda et al. | 365/226 |
| 6,226,224 B1 | * | 5/2001 | Banba et al. | 365/226 |
| 6,335,895 B1 | * | 1/2002 | Sugibayashi | 365/227 |
| 6,549,480 B2 | * | 4/2003 | Hosogane et al. | 365/226 |

* cited by examiner

Primary Examiner—Gene Auduong
(74) Attorney, Agent, or Firm—Volentine Francos, PLLC

(57) ABSTRACT

A power-source controller for reducing current consumption while a DRAM is in standby, includes a mode detection circuit inverting a disable signal having an L-level under the enable state and having an H-level under the disable state; an internal-power-source driver circuit having first and second transistors; and an internal-power-source reference circuit setting first and second driver control signals respectively to L-level and H-level when an L-level disable signal is input to turn on the first transistor and turn off the second transistor, supplying an external-power-source voltage as an internal-power-source voltage, setting the first driver control signal to H-level when an H-level disable signal is input, controlling the level of the second driver control signal to turn off the second transistor and control the first transistor, and supplying an internal power-source voltage lower than the external-power-source voltage.

19 Claims, 23 Drawing Sheets

US 6,791,894 B2

DRAM POWER-SOURCE CONTROLLER THAT REDUCES CURRENT CONSUMPTION DURING STANDBY

BACKGROUND OF THE INVENTION

The present invention relates to a power-source controller for reducing the current consumption when a DRAM is standby.

DESCRIPTION OF THE RELATED ART

In general, when a DRAM is standby, /RAS and /CAS which are external clock signals are fixed to H-level and bit lines are equalized and a data bus and peripheral circuit are initialized. Main circuits consuming a current when the DRAM is standby are a word-line-voltage step-up circuit and a back-bias step-down circuit. When it is detected by a sensor the word-line voltage and back bias respectively become lower than a certain value even under a standby state, they are pumped by an oscillator and their set values are held. Therefore, current is always consumed by the sensor and pumping even under a standby state. Moreover, when a word line and a bit line are short-circuited in a memory cell by a process defect, a current is always consumed between a power source (VCC) and the GND (VSS).

As the demand of a DRAM for a portable unit rises, less current consumption is requested. However, in the case of the prior art, there is only a method for lowering a power-source voltage in order to reduce the current consumption under a standby state. In the case of this method, control by an actual unit is very complex.

SUMMARY OF THE INVENTION

A power-source controller of an DRAM of the present invention is provided with power-source-voltage control means for supplying the voltage of an external power source as that of an internal power source when detecting the enable state of the DRAM and supplying a voltage lower than the voltage of the external power source to the internal power source when detecting the disable state of the DRAM.

Moreover, a DRAM power-source controller of the present invention is provided with power-source-voltage control means for supplying the voltage of an external power source as that of an internal power source when detecting the enable state of the DRAM and setting the internal power source to the ground level when detecting the disable state of the DRAM.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Embodiment 1

Figure 1:
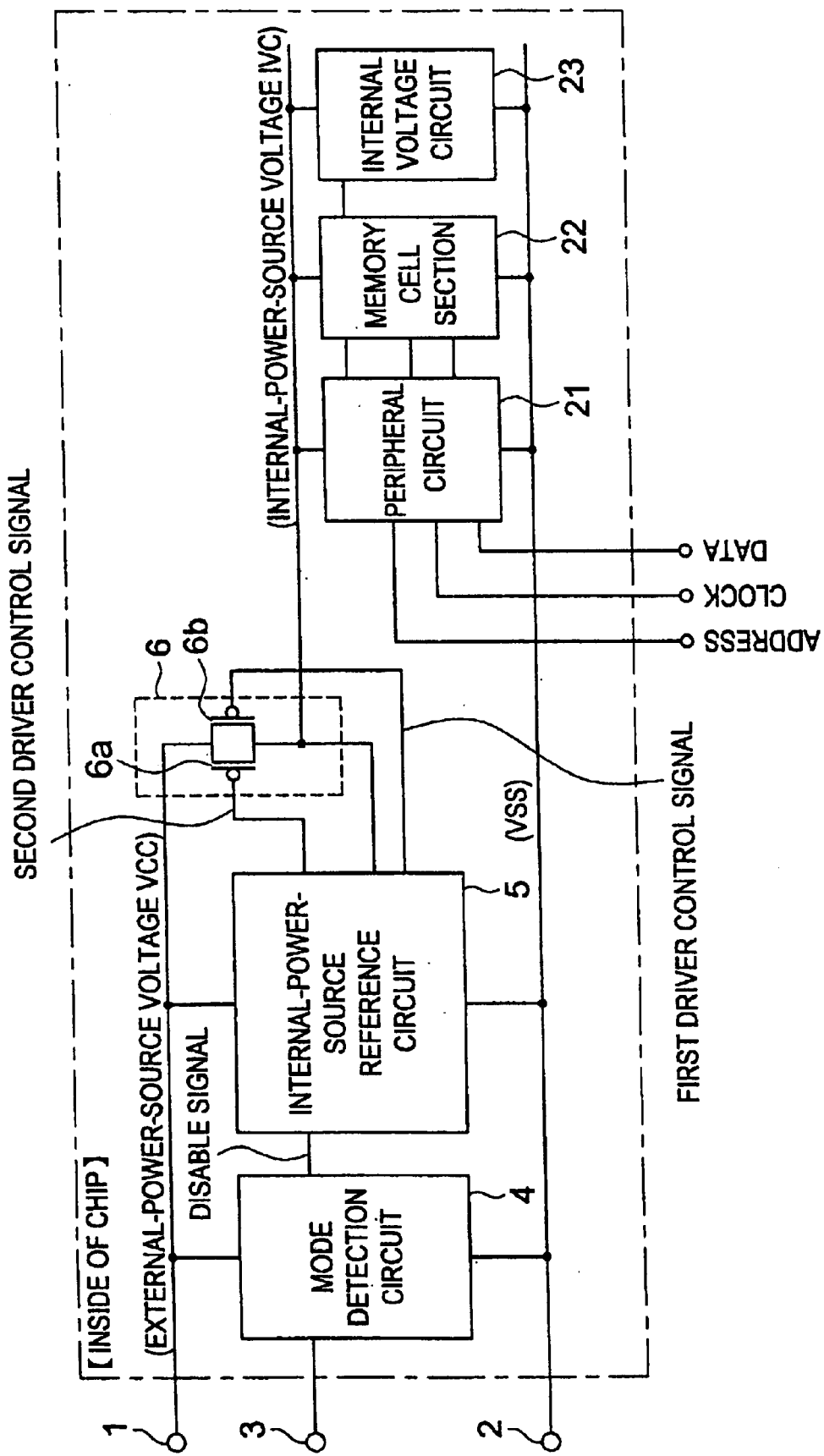
FIG. 1 is a block diagram showing a configuration of a DRAM power-source controller of embodiment 1 of the present invention.

FIG. 1 is a block diagram showing a configuration of the DRAM power-source controller of the embodiment 1 of the present invention.

Figure 2:
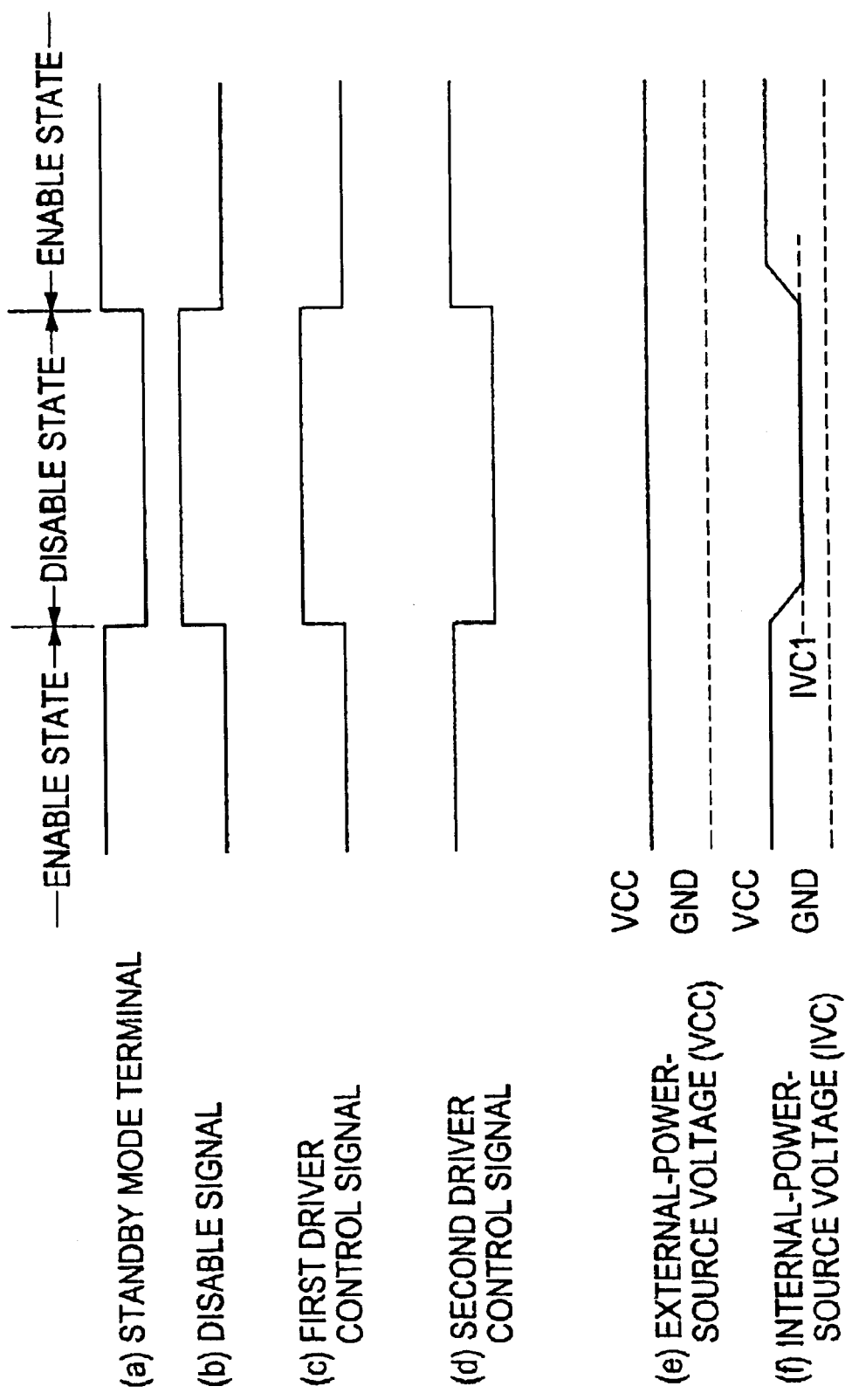
FIGS. 2(a) to 2(f) are waveform diagrams showing operations of a DRAM power-source controller.

FIG. 2 is a waveform diagram showing operations of a DRAM power-source controller.

Figure 3:
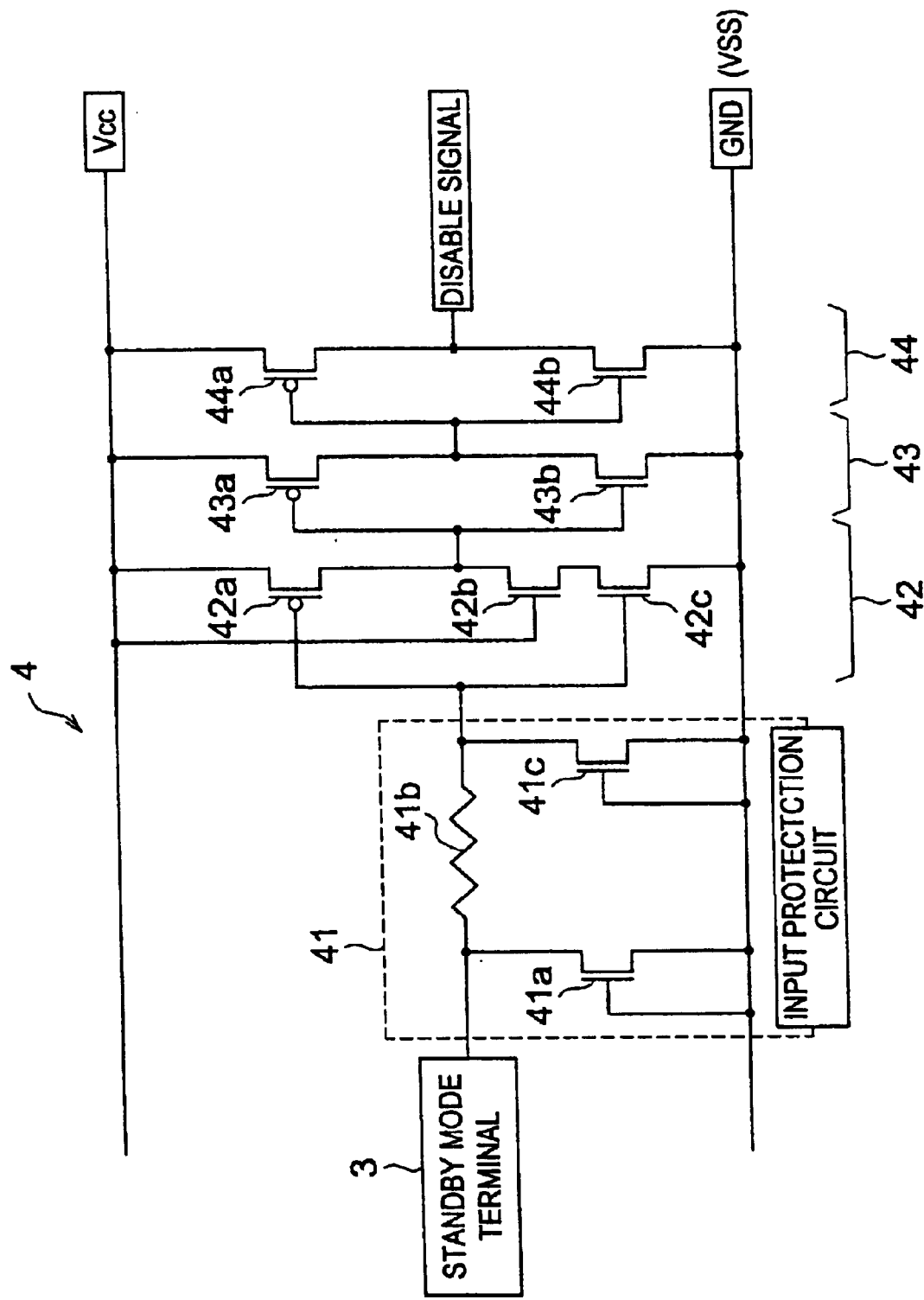
FIG. 3 is an illustration of a mode detection circuit.

FIG. 3 is an illustration of a mode detection circuit.

Figure 4:
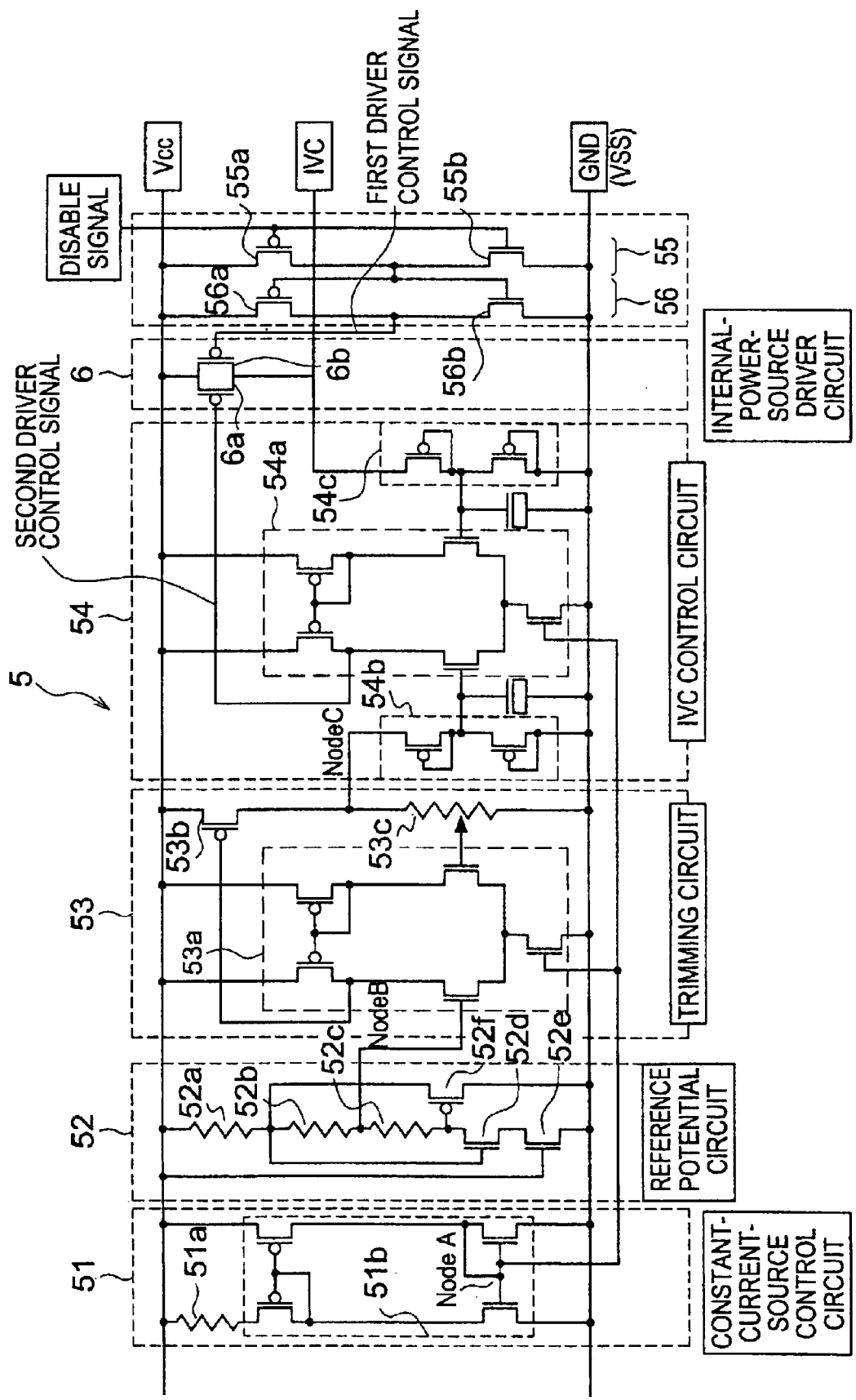
FIG. 4 is an illustration of an internal-power-source reference circuit and an internal-power-source driver circuit.

FIG. 4 is an illustration of an internal-power-source reference circuit and an internal-power-source driver circuit.

The DRAM power-source controller shown in FIG. 1 is constituted by a mode detection circuit 4, an internal-power-source reference circuit 5, and an internal-power-source driver circuit 6. The mode detection circuit 4 is set between a power-source terminal 1 to which an external voltage VCC is applied and a GND terminal 2. Then, when a standby mode terminal 3 is kept H-level (enable state), the circuit 4 outputs an L-level disable signal. Moreover, when the standby mode terminal 3 becomes L-level (disable state), the circuit 4 inverts the disable signal into H-level. The internal-power-source reference circuit 5 is connected to the mode detection circuit 4 in parallel. Then, the internal-power-source reference circuit 5 sets a first driver control signal to L-level and a second driver control signal to H-level when an L-level disable signal is input and converts the first driver signal into H-level and controls the level of the second driver control signal when an H-level disable signal is input. Under the enable state, a Pch-Tr 6b is turned on in accordance with an L-level first driver control signal and a Pch-Tr 6a is turned off in accordance with an H-level second driver control signal, and the internal-power-source driver circuit 6 supplies an external-power-source voltage VCC to a peripheral circuit 21, memory cell 22, and internal voltage circuit 23 as an internal-power-source voltage IVC. Under the disable state, Pch-Tr 6b is turned off in accordance with an H-level first control signal and Pch-Tr 6a is turned on in accordance with the level of a second driver signal and supplies an internal-power-source voltage IVC1 lower than the external-power-source voltage VCC to the peripheral circuit 21, memory cell 22, and internal voltage circuit 23.

When the standby mode terminal 3 becomes H-level, a DRAM normally operates (enable state). When the standby mode terminal 3 becomes L-level, the DRAM stops operations or it is unnecessary to store the information in the memory cell 12 (disable state).

As shown in FIG. 3, the above mode detection circuit 4 is constituted by an input protection circuit 41, an input initial-stage circuit 42, a first inverter 43, and a second inverter 44.

The input protection circuit 41 is constituted by Nch-Tr 41a whose drain is connected to the standby mode terminal 3 and whose gate and source are connected to the GND, a resistive element 41b whose one end is connected to the standby mode terminal 3 and whose other end is connected to the output side of the circuit 41, and Nch-Tr 41c whose drain is connected to the other end of the resistive element 41b and whose gate and source are connected to the GND (VSS).

The input initial-stage circuit 42 is constituted by a Pch-Tr 42a whose drain is connected to the external-power-source voltage VCC, whose gate is connected to the output side of the input protection circuit 41, and whose source is connected to the output side of this circuit 42, Nch-Tr 42b whose gate is connected to the external-power-source voltage VCC and whose drain is connected to the output side of this circuit 42, and Nch-Tr 42c whose gate is connected to the output side of the input protection circuit 41 and set between the source of Nch-Tr 42b and GND. When the standby mode terminal 3 is kept H-level (enable state), Nch-Tr 42b and Nch-Tr 42c are turned on and the input initial-stage circuit 42 sets an output to L-level. Moreover, when the standby mode terminal 3 is kept L-level (disable state), Pch-Tr 42a is turned on to invert an output into H-level.

The first inverter 43 is constituted by a Pch-Tr 43a whose drain is connected to the external-power-source voltage VCC, whose gate is connected to the output side of the input initial-stage circuit 42, and whose source is connected to the output side of this inverter 43 and Nch-Tr 43b whose gate is connected to the output side of the input initial-stage circuit 42, drain is connected to the output side of this inverter 43 and whose source is connected to the GND. When an output of the input initial-stage circuit 42 is kept L-level (enable state), Pch-Tr 43a is turned on and the first inverter 43 sets an output to H-level. When an output of the input initial-stage circuit 42 is kept H-level (disable state), Nch-Tr 43b is turned on and the first inverter 43 inverts an output to L-level.

Moreover, the second inverter 44 is constituted by a Pch-Tr 44a whose drain is connected to the external-power-source voltage VCC, whose gate is connected to the output side of the inverter 43, and whose source is connected to the output side of this inverter 44 and an Nch-Tr 44b whose gate is connected to the output side of the inverter 43, whose drain is connected to the output side of this inverter 44, and whose source is connected to the GND. When an output of the first inverter 43 is kept H-level (enable state), Nch-Tr 44b is turned on and the second inverter 44 outputs an L-level disable signal. When an output of the first inverter 43 is kept L-level (disable state), Pch-Tr 44a is turned on and the second inverter 44 converts the disable signal into H-level.

As shown in FIG. 4, the above internal-power-source reference circuit 5 is constituted by a constant-current-source control circuit 51, a reference potential circuit 52, a trimming circuit 53, an IVC control circuit 54, and first and second inverters 55 and 56.

The constant-current-source control circuit 51 is constituted by a resistive element 51a and a current mirror 51b to output a constant current generated at the gate connection point NodeA of a pair of Nch-Trs. The reference potential circuit 52 is constituted by resistive elements 52a, 52b, and 52c branched from the external-power-source voltage VCC and connected in series, Nch-Tr 52d whose drain is connected to the resistive element 52c and whose gate is connected to the connection point between the resistive elements 52a and 52b respectively, Nch-Tr 52e whose drain is connected to the source of Nch-Tr 52d and whose gate is connected to the external-power-source voltage VCC, and whose source is connected to the GND, and a Pch-Tr 52f whose drain is connected to the connection point between the resistive elements 52a and 52b, whose gate is connected to the drain of Nch-Tr 52d, and whose source is connected to the GND. Moreover, the circuit 52 outputs a reference potential generated at the connection point NodeB between the resistive elements 52b and 52c.

The trimming circuit 53 is constituted by a differential amplifier 53a using a constant current generated at NodeA of the constant-current-source control circuit 51 as the power-source current for a bias, a Pch-Tr 53b whose drain is connected the external-power-source voltage VCC and whose gate is connected to the output side of the differential amplifier 53a, and a resistive element 53c whose one end is connected to the source of Pch-Tr 53b and whose other end is connected to the GND. Moreover, the circuit 53 compares a reference potential generated at NodeB of the reference potential circuit 52 with an optional point of the resistive element 53c and outputs a potential amplified in accordance with a resistance distribution ratio from the connection point NodeC of the Pch-Tr 53b and the resistive element 53c.

The IVC control circuit 54 is constituted by a differential amplifier 54a using a constant current generated at NodeA of the constant-current-source control circuit 51 as a power source for a bias, a Pch-Tr and Mos-Tr connected between NodeC of the trimming circuit 53 and the GND in series, a first half-value circuit 54b for setting the potential generated at the above NodeC to ½ level, a Pch-Tr and Mos-Tr connected between the internal-power-source voltage IVC and the GND in series, and a second half-value circuit 54c for setting the internal power source voltage IVC to ½ level. Moreover, because when Pch-Tr 6b of the internal-powersource driver circuit 6 is turned on, the output level of the second half-value circuit 54c is sufficiently higher than the output level of the first half-value circuit 54b, the circuit 54 outputs an H-level second driver control signal to the internal-power-source driver circuit 6 in accordance with an output of the differential amplifier 54a to turn off Pch-Tr 6a. Moreover, when Pch-Tr 6b is turned off, a second driver control signal is generated by the differential amplifier 54a to control Pch-Tr 6a in order to obtain the internal power-source voltage IVC1 decided in accordance with the output level of the first half-value circuit 54b after natural discharge due to junction leak or off-leak of the peripheral circuit 21.

The first inverter 55 is constituted by a Pch-Tr 55a whose drain is connected to the external-power-source voltage VCC and whose gate is connected to the output side (disable signal) of the mode detection circuit 4 and Nch-Tr 55b whose drain is connected to whose drain is connected to the source of Pch-Tr 55a, whose gage is connected to the output side of the mode detection circuit 4, and whose source is connected to the GND. Moreover, when a disable signal output from the mode detection circuit 4 is kept L-level (enable state), Pch-Tr 55a is turned on to set an output (connection point between Pch-Tr 55a and Nch-Tr 55b) to H-level. When the disable signal is kept H-level, Nch-Tr 55b is turned on to invert the output into L-level.

The second inverter 56 is constituted by Pch-Tr 56a whose drain is connected to the external power-source VCC and whose gate is connected to the output side of the first inverter 55 and Nch-Tr 56b whose drain is connected to the source of a Pch-Tr 56a, whose gate is connected to the output side of the first inverter 55, and whose source is connected to the GND. Moreover, When an output of the first inverter 55 is kept H-level (enable state), Nch-Tr 56b is turned on to output the L-level first driver control signal to the internal-power-source driver circuit 6. When the output of the first inverter 55 is kept L-level (disable state), Pch-Tr 56a is turned on to invert the first driver control signal to H-level and turn off Pch-Tr 6b of the internal-power-source driver circuit 6.

As shown in FIG. 4, the above-described internal-power-source driver circuit 6 is constituted by Pch-Tr 6a whose drain is connected to the external-power-source voltage VCC, whose gate is connected to the output side of the differential amplifier 54a of the IVC control circuit 54, and whose source is connected to the internal-power-source voltage IVC and Pch-Tr 6b whose drain is connected to the external-power-source voltage VCC, whose gate is connected to the output side of the second inverter 56, and whose source is connected to the internal-power-source voltage IVC.

Then, operations of the embodiment 1 are described below by referring to waveform diagrams shown in FIGS. 2(a) to 2(f).

When the standby mode terminal 3 is kept H-level (enable state)(refer to FIG. 2(a)), the mode detection circuit 4 generates an L-level disable signal by the input initial-stage circuit 42 and inverters 43 and 44 of two stages (refer to FIG. 2(b)) and outputs the signal to the internal-power-source reference circuit 5. When the L-level disable signal is input to the internal-power-source reference circuit 5, the internal-power-source reference circuit 5 generates an L-level first driver control signal by the first and second inverters 55 and 56 (refer to FIG. 2(c)). Then, the circuit 5 turns on Pch-Tr 6b of the internal-power-source driver circuit 6 and supplies the external power-source voltage VCC to the peripheral circuit 21, memory cell 22, and internal voltage circuit 23 as the internal power-source voltage IVC (refer to FIGS. 2(e) and 2(f)). In this case, because the output level of the first half-value circuit 54b of the IVC control circuit 54 becomes sufficiently higher than the output level of the second half-value circuit 54c of the circuit 54, an output (second driver control signal) of the differential amplifier 54a become H-level (refer to FIG. 2(d)) to turn off Pch-Tr 6a of the internal-power-source driver 6.

Moreover, when the standby mode terminal 3 becomes L-level (disable state) (refer to FIG. 2(a)), the mode detection circuit 4 converts an L-level disable signal into H-level disable signal (refer to FIG. 2(b)) and outputs the signal to the internal-power-source reference circuit 5. When the H-level disable signal is input, the internal-power-source reference circuit 5 inverts a first driver control signal into H-level (refer to FIG. 2(c)) and turns off Pch-Tr 6b of the internal-power-source driver 6. The IVC control circuit 54 generates a second driver control signal by the differential amplifier 54a in order to obtain the internal-power-source voltage IVC1 decided in accordance with the output level of the first half-value circuit 54b after natural discharge due to junction leak or off-leak of the peripheral circuit 21 (refer to FIG. 2(d)) to control Pch-Tr 6a of the internal-power-source driver 6 (refer to FIGS. 2(e) and 2(f)).

As described above, the embodiment 1 is provided with:
the mode detection circuit 4 for setting a disable signal to L-level when the standby mode terminal 3 is kept H-level (enable state) and inverts the L-level disable signal into H-level when the standby mode terminal 3 is kept L-level (disable state);

the internal-power-source reference circuit 5 for setting a first driver control signal to L-level and a second driver control signal to H-level when an L-level disable signal is input and inverts the L-level first driver signal into H-level and controls the level of the second driver control signal when a H-level disable signal is input; and the internal-power-source driver circuit 6 for supplying the external-power-source voltage VCC to the peripheral circuit 21, memory cell 22, and internal voltage circuit 23 as the internal-power-source voltage IVC because Pch-Tr 6b is turned on in accordance with an L-level first driver control signal and Pch-Tr 6a is turned off in accordance with an H-level second driver control signal under the enable state and supplying the internal-power-source voltage IVC1 lower than the external voltage VCC to the peripheral circuit 21, memory cell 22, and internal voltage circuit 23 because Pch-Tr 6b is turned off in accordance with an H-level first driver control signal and Pch-Tr 6a is turned on in accordance with the level of a second driver control signal under the disable state. Therefore, it is possible to reduce a standby current under the disable state and suppress power consumption without fluctuating the voltage of the external-power-source voltage VCC.

Embodiment 2

Figure 5:
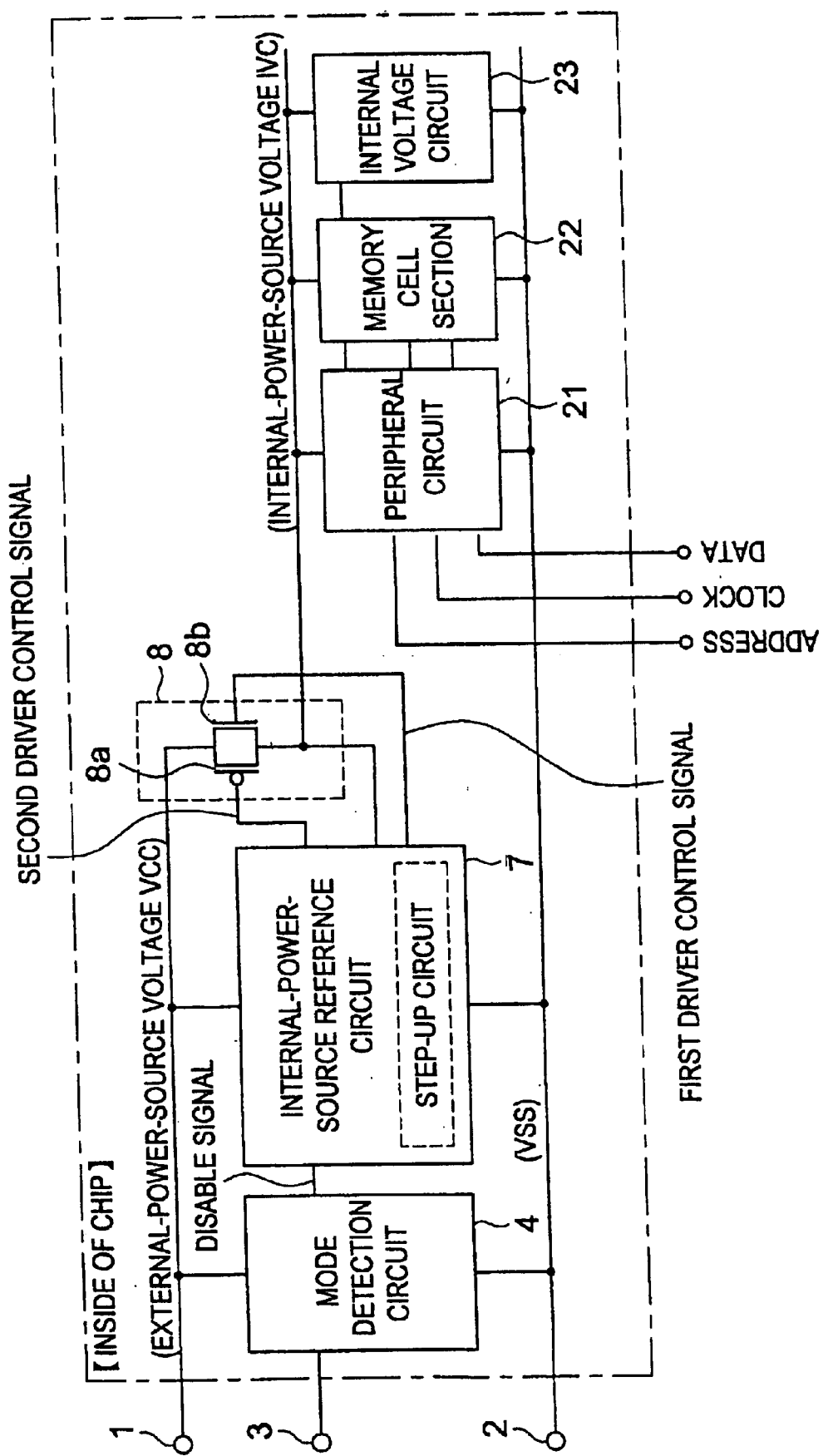
FIG. 5 is a block diagram showing a configuration of a DRAM power-source controller of embodiment 2 of the present invention.
Figure 6:
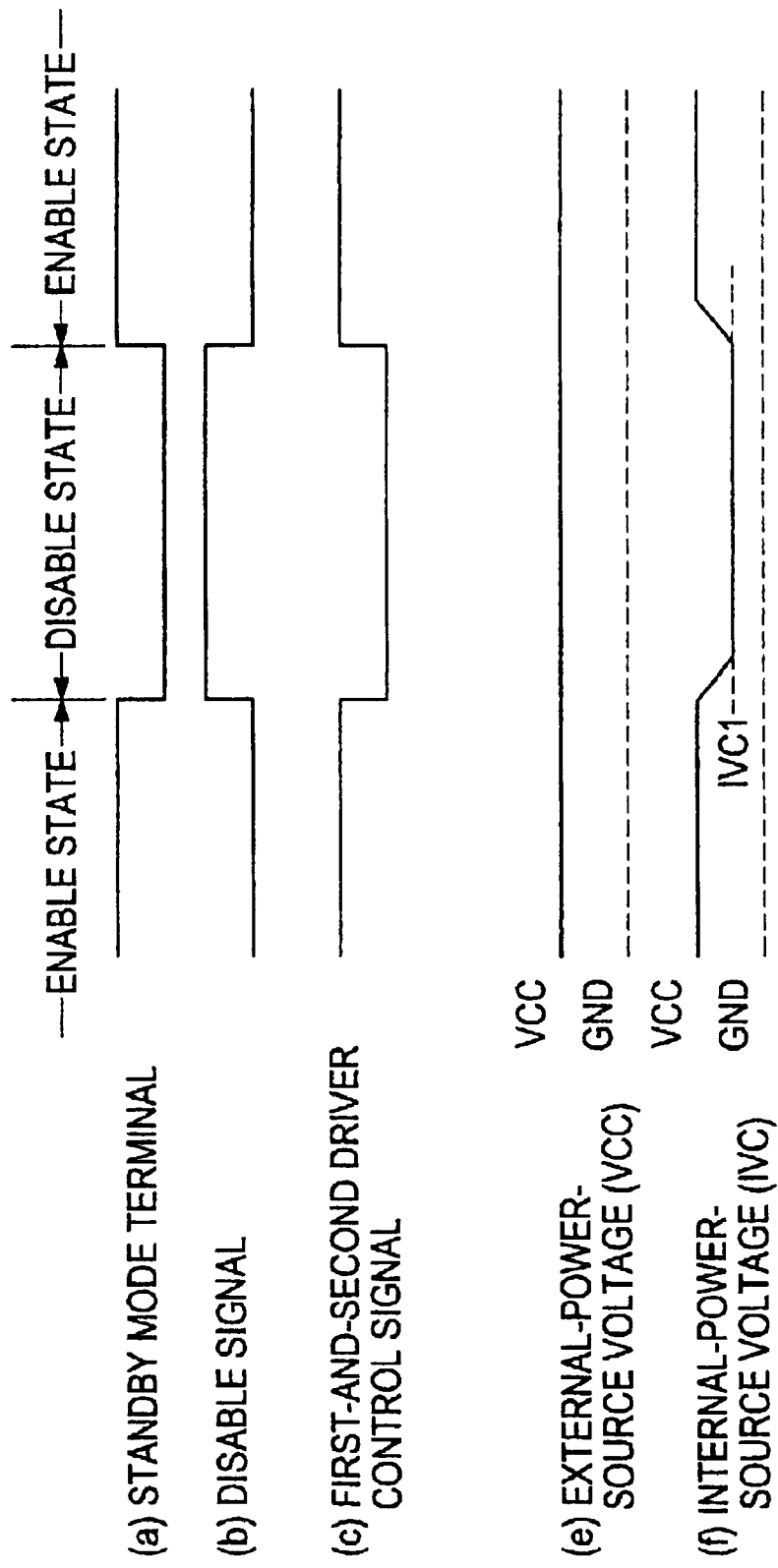
FIGS. 6(a) to 6(c) and 6(e), and 6(f) are waveform diagrams showing operations of a DRAM power-source controller.
Figure 7:
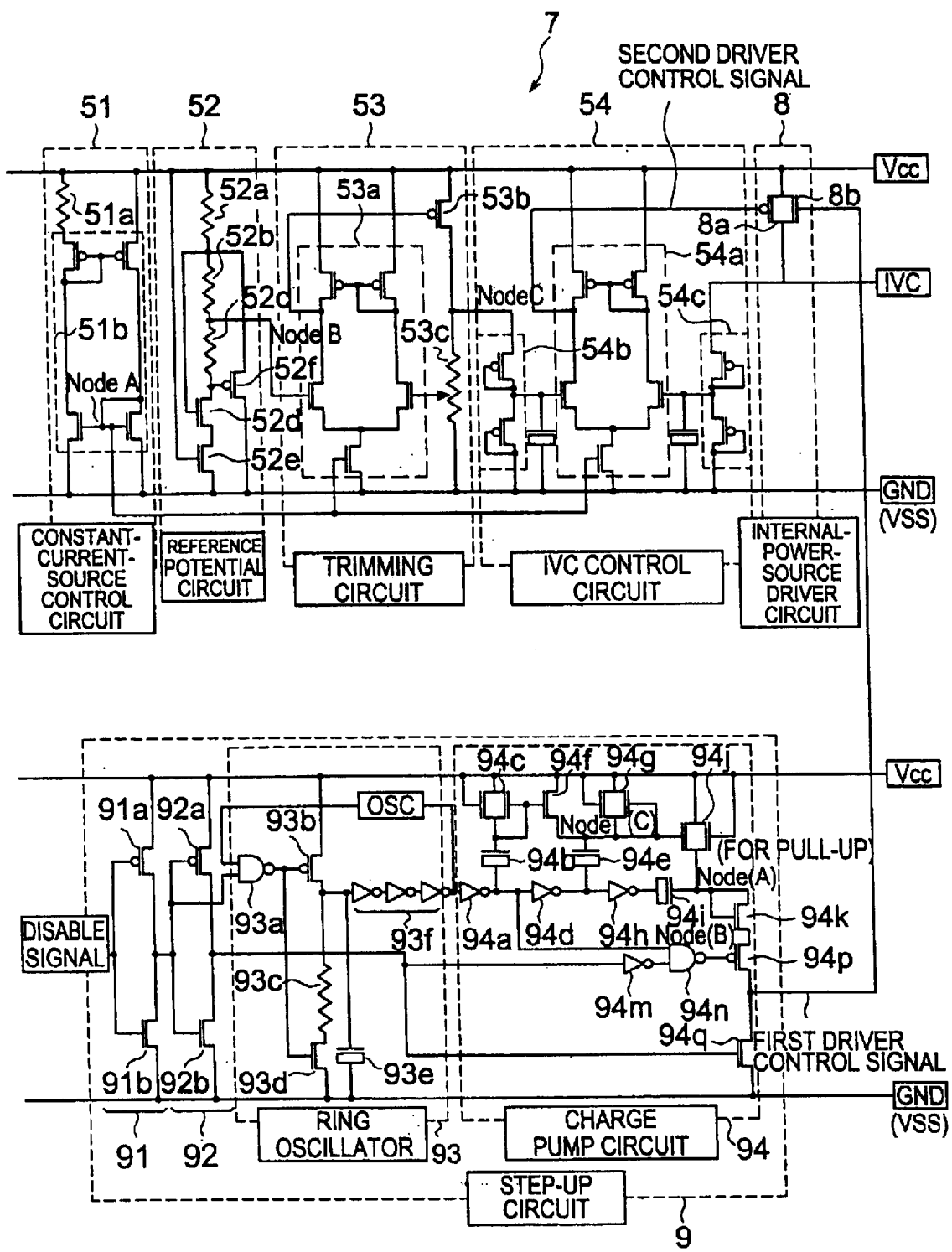
FIG. 7 is an illustration of an internal-power-source driver circuit and an internal-power-source driver circuit.

FIG. 5 is a block diagram showing a configuration of the DRAM power-source controller of the embodiment 2 of the present invention, FIGS. 6(a) to 6(f) are waveform diagrams showing operations of the DRAM power-source controller, and FIG. 7 is an illustration of an internal-power-source reference circuit and an internal-power-source driver circuit.

A portion same as or corresponding to the portion of the embodiment 1 described for FIGS. 1, 3 and 4 is provided with the same symbol and its description is omitted.

The DRAM power-source controller shown in FIG. 5 is constituted by the above-described mode detection circuit 4, internal-power-source reference circuit 7, and internalpower-source driver circuit 8. The internal-power-source reference circuit 7 outputs an H-level first driver control signal and an H-level second driver control signal which are stepped-up to an external-power-source voltage VCC or higher when a disable signal output from the mode detection circuit 4 is kept L-level (enable state). Then, when the disable signal is kept H-level (disable state), the circuit 7 inverts the H-level first driver control signal into L-level and outputs a second driver control signal whose level is controlled so that an internal-power-source voltage IVC lower than the external-power-source voltage VCC is provided. When H-level first and second driver control signals are input, Nch-Tr 8b is turned on and Pch-Tr 8a is turned off and the internal-power-source driver circuit 8 supplies the external-power-source voltage VCC to the peripheral circuit 21, memory cell 22, and internal voltage circuit 23 as the internal-power-source voltage IVC (=VCC). Then, when L-level first and second driver control signals are input, the Nch-Tr 8b is turned off and Pch-Tr 8a is turned on and the circuit 8 supplies an internal-power-source voltage IVC1 lower than the external-power-source voltage VCC to the peripheral circuit 21, memory cell 22, and internal voltage circuit 23.

As shown in FIG. 7, the above-described internal-power-source reference circuit 7 is constituted by a step-up circuit 9, constant-current-source control circuit 51, reference potential circuit 52, trimming circuit 53, and IVC control circuit 54. The constant-current-source control circuit 51 outputs a constant current generated at the gate connection point NodeA between a pair of Nch-Trs. The reference potential circuit 52 outputs a reference potential generated at the connection point NodeB between the resistive elements 52b and 52c. The reference potential circuit 52 outputs a reference potential generated at the connection point NodeB between the resistive elements 52b and 52c. The trimming circuit 53 compares the reference potential generated at the connection point NodeB of the reference potential circuit 52 with an optional point of the resistive element 53c and outputs a potential amplified in accordance with a resistance distribution ratio from the connection point NodeC between Pch-Tr 53b and resistive element 53c. In the case of the IVC control circuit 54, when the internal-power-source voltage IVC reaches the same level as the external-power-source voltage VCC because Nch-Tr 8b is turned on, the output level of the second half-value circuit 54c becomes higher than the output level of the first half-value circuit 54b, the output (second driver control signal) of the differential amplifier 54a become H-level. Moreover, when Nch-Tr 8b is turned off, an L-level second driver control signal based on the output level of the first half-value circuit 54b is output from the differential amplifier 54a.

The above step-up circuit 9 is provided with a first inverter 91, a second inverter 92, a ring oscillator 93, and a charge pump circuit 94.

The first inverter 91 is constituted by Pch-Tr 91a whose drain is connected to the external-power-source voltage VCC, whose gate is connected to the output side of the mode detection circuit 4, and whose source is connected to the output side of this inverter 91 and a Nch-Tr 91b whose gate is connected to the output side of the mode detection circuit 4, whose drain is connected to the source of Pch-Tr 91a, and whose source is connected to the GND (VSS). Moreover, Pch-Tr 91a is turned on to set an output to H-level when the disable signal of the mode detection circuit 4 is kept L-level (enable state) and Nch-Tr 91b is turned on to set the output to L-level when the disable signal is inverted into H-level (disable state).

The second inverter 92 is constituted by Pch-Tr 92a whose drain is connected to the external-power-source voltage VCC, whose gate is connected to the output side of the first inverter 91, and whose source is connected to the output side of this inverter 92 and Nch-Tr 92b whose gate is connected to the output side of the first inverter 91, whose drain is connected to the source of Pch-Tr 92a, and whose source is connected to the GND (VSS). Moreover, when an output of the first inverter 91 is kept H-level (enable state), Nch-Tr 92b is turned on to convert the H-level output into L-level. Moreover, when an output of the first inverter 92 is kept L-level (disable state), Pch-Tr 92a is turned on to convert the L-level output into H-level.

The ring oscillator 93 is constituted by a NAND 93a to which an output of the first inverter 91 and an OSC are input, Pch-Tr 93b whose gate is connected to the output side of the NAND 93a and whose drain is connected to the external-power-source voltage VCC, a resistive element 93c whose one end is connected to the source of Pch-Tr 93b, Nch-Tr 93d whose drain is connected to the other end of the resistive element 93c, whose gate is connected to the output side of the NAND 93a, and whose source is connected to the GND (VSS), an Mos-CAP 93e whose one end is connected to the source of Pch-Tr 93b and whose other end is connected to the GND (VSS) to constitute a delay circuit with the resistive element 93c, and a three-stage inverter 93f whose input end is connected to the source of Pch-Tr 93b and whose output end is connected to the input side of the NAND 93a.

In the case of the ring oscillator 93, when an output of the first inverter 91 becomes H-level (enable state), an OSC signal is changed from H-level to L-level. Then, the OSC signal is changed from L-level to H-level after a delay time generated by the delay circuit constituted by the resistive element 93c and Mos-CAP 93e elapses and this cycle is repeated. Moreover, when an output of the first inverter 91 is inverted into L-level (disable state), the level of the OSC signal remains H-level.

The charge pump circuit 94 has a first inverter 94a to which an OSC signal is input from the ring oscillator 93, a step-up Mos-CAP 94b whose one end (source and drain) is connected to the output side of the first inverter 94a, Nch-Tr 94c for PULL UP and CLUMP set between the external-power-source voltage VCC and the step-up Mos-CAP 94b, a second inverter 94d set to the output side of the first inverter 94a, a step-up Mos-CAP 94e whose one end (source and drain) is connected to the output side of the second inverter 94d, Nch-Tr 94f whose drain is connected to the external-power-source voltage VCC, whose gate is connected to the other end (gate) of the Mos-CAP 94b, and whose source is connected to Node(C) of the other end (gate) of the step-up Mos-CAP 94e, Nch-Tr 94g for PULL UP and CLUMP set between the external-power-source voltage VCC and Node(C) of the other end (gate) of the step-up Mos-CAP 94e, a third inverter 94h set to the output side of the second inverter 94d, a Mos-CAP 94i for pumping set to the output side of the third inverter 94h, and an Nch-Tr for PULL-UP, and is constituted by Nch-Tr 94j whose drain is connected to the external-power-source voltage VCC, whose gate is connected to Node(C), and whose source is connected to Node(A) of one end (gate) of the Mos-CAP 94i for pumping, Nch-Tr 94k whose drain and gate are connected to Node(A) and whose source is connected to Node (B), a fourth inverter 94m to which an output of the second inverter 92 set to the front stage of the ring oscillator 93, a NAND 94n to which outputs of the first inverter 94a and fourth inverter 94m are input, Pch-Tr 94p whose drain is connected to Node(B), whose gate is connected to the output side of the NAND 94n, and whose source is connected to the output side of this circuit 94, and Nch-Tr 94q whose drain is connected to the source of Pch-Tr 94p, whose gate is connected to the output side off the second inverter 92, and whose source is connected to the GND (VSS).

In the case of the charge pump circuit 94, Node(C) reaches an external-power-source voltage or higher (VCC+Vtn+α) when the OSC signal of an output of the ring oscillator 93 is kept H-level. Moreover, because an output of the third inverter 94h becomes L-level, Node(A) becomes VCC-level and Node(B) becomes VCC-Vtn-level. However, because an output of the first inverter 94a is kept L-level, Pch-Tr 94p is turned off and an output of this circuit 94 becomes L-level. When the OSC signal output from the ring oscillator 93 is inverted into L-level, Node(C) reaches VCC and an output of the third inverter 94h is inverted from L-level to H-level. Therefore, Node(A) is changed from VCC level to VCC+Vtn+α level and Node(B) becomes VCC+α-level. Moreover, because an output of the first inverter 94a is inverted from L-level into H-level, Pch-Tr 94p is turned on, and an output of this circuit 94 becomes VCC+α-level and is output as a first driver control signal. As described above, because the above OSC signal is oscillated at a constant frequency by the ring oscillator 93, the case in which the OSC signal is kept H-level and the operation when the OSC signal is kept H-level are repeated and an output of this circuit 94 finally becomes VCC+Vtn+α-level.

When the OSC signal of the ring oscillator 93 according to input of an L-level disable signal is kept H-level, an output of the second inverter 92 is kept H-level and thereby, Pch-Tr 94p is turned off, Nch-Tr 94q is turned on, and an output of this circuit becomes L-level.

As shown in FIG. 7, the internal-power-source driver circuit 8 is constituted by Pch-Tr 8a whose drain is connected to the external-power-source voltage VCC, whose gate is connected to the output side of the IVC control circuit 54, and whose source is connected to the internal-power-source voltage IVC and Nch-Tr 8b whose drain is connected to the external-power-source voltage VCC, whose gate is connected to the output side of the step-up circuit 9, and whose source is connected to the internal-power-source voltage IVC. When the first driver control signal of an output of the step-up circuit 9 and the second driver control signal of an output of the IVC control circuit 54 are kept H-level, Nch-Tr 8b is turned on and Pch-Tr 8a is turned off and thereby, the external-power-source voltage IVC (=VCC) is supplied to the peripheral circuit 21, memory cell 22, and internal voltage circuit 23 as the internal-power-source voltage IVC (=VCC). When the above first and second driver control signals are inverted into L-level, Nch-Tr 8b is turned off and Pch-Tr 8a is turned on and thereby, the internal-power-source voltage IVC1 lower than the external-power-source voltage VCC is supplied to the peripheral circuit 21, memory cell 22, and internal voltage circuit 23.

Then, operations of the embodiment 2 are described by referring to the waveform diagrams shown in FIGS. 6(a) to 6(f).

When the standby mode terminal 3 becomes H-level (enable state) (refer to FIG. 6(a)), the mode detection circuit 4 outputs an L-level disable signal to the internal-power-source reference circuit 7 (refer to FIG. 6(b)). When the L-level disable signal is input, the internal-power-source reference circuit 7 steps up the level of a first driver control signal up to VCC+Vtn+α by the ring oscillator 93 and the step-up circuit 94 (refer to FIG. 6(c)), turns on Nch-Tr 8b of the internal-power-source driver circuit 8, and supplies the external-power-source voltage VCC to the peripheral circuit 21, memory cell 22, and internal voltage circuit 23 as the internal-power-source voltage IVC (refer to FIGS. 6(d) and (e)). In this case, because the output level of the second half-value circuit 54c becomes higher than that of the first half-value circuit 54b of the IVC control circuit 54, an output of the differential amplifier 54a becomes H-level (refer to FIG. 6(c)) to turn off Pch-Tr 8a of the internal-power-source driver 6 as a second driver control signal.

Moreover, when the standby mode terminal 3 is inverted from H-level into L-level (disable state) (refer to FIG. 6(a)), the mode detection circuit 4 outputs an H-level disable signal to the internal-power-source reference circuit 7 (refer to FIG. 6(b)). When the H-level disable signal is input, the internal-power-source reference circuit 7 inverts an H-level first driver control signal into L-level (refer to FIG. 6(c)) and turns off Nch-Tr 8b of the internal-power-source driver circuit 8 because the OSC signal of the ring oscillator 93 of the step-up circuit 9 is kept H-level, an output of the second inverter 92 of the step-up circuit 9 becomes H-level, and Pch-Tr 94p of the charge pump circuit 94 is turned off and Nch-Tr 94q of the circuit 94 is turned on. In this case, the IVC control circuit 54 controls Pch-Tr 8a in accordance with the output (second driver control signal) of the differential amplifier 54a according to the output level of the first half-value circuit 54b, generates a predetermined-level internal-power-source voltage IVC1, and supplies the voltage IVC1 to the peripheral circuit 21, memory cell 22, and internal voltage circuit 23 (refer to FIGS. 6(d) and 6(e)).

As described above, the embodiment 2 is provided with:

the mode detection circuit 4 for outputting an L-level disable signal when the standby mode terminal 3 is kept H-level (enable state) and inverting the L-level disable signal into H-level when the standby mode terminal 3 is kept L-level (disable state);

the internal-power-source reference circuit 7 for outputting a first driver control signal stepped-up to VCC+Vtn+α and an H-level second driver control signal when an L-level disable signal is input (enable state), inverting a first driver control signal into L-level, and outputting a L-level second driver control signal level-controlled so that a predetermined internal-power-source voltage IVC1 is obtained when a disable signal becomes H-level signal (disable state); and the internal-power-source driver circuit 8 for supplying the external-power-source voltage VCC to the peripheral circuit 21, memory cell 22, and internal voltage circuit 23 as the internal-power-source voltage IVC because Nch-Tr 8b is turned on and Pch-Tr 8a is turned off when H-level first and second driver control signals are input and supplying the internal-power-source voltage IVC1 lower than the external voltage VCC to the peripheral circuit 21, memory cell 22, and internal voltage circuit 23 because Nch-Tr 8b is turned off and Pch-Tr 8a is turned on when L-level first and second driver control signals are input. Therefore, it is possible to reduce the standby current under the disable state without fluctuating the voltage of the external-power-source voltage VCC. Moreover, because Nch-Tr 8b is used for one internal-power-source driver circuit 8, the mobility is accelerated and the response speed is increased. Thereby, it is possible to decrease the internal-power-source driver circuit 8 in size and decrease a pattern area.

Embodiment 3

Figure 8:
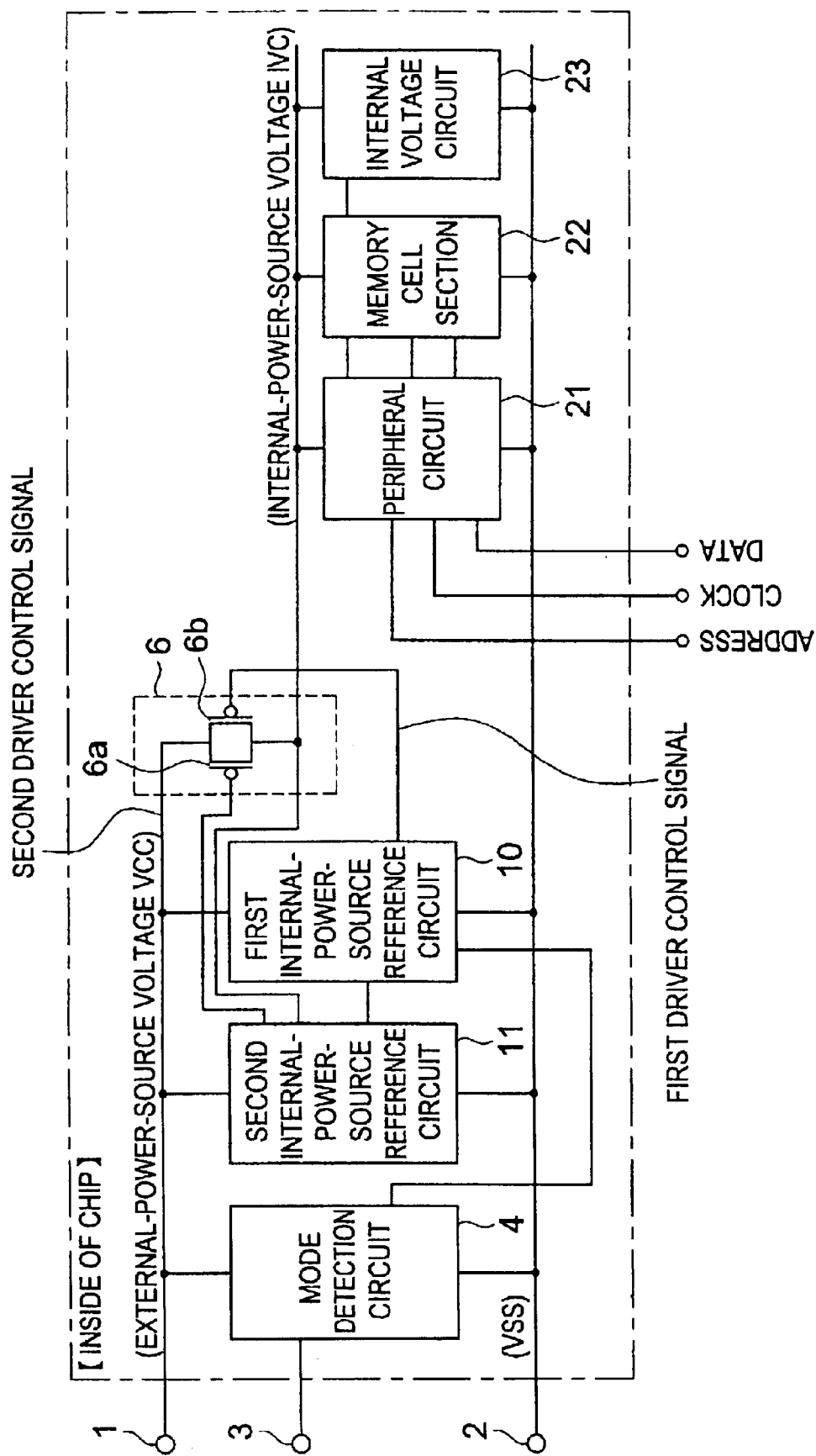
FIG. 8 is a block diagram showing a configuration of a DRAM power-source controller of embodiment 3 of the present invention.
Figure 9:
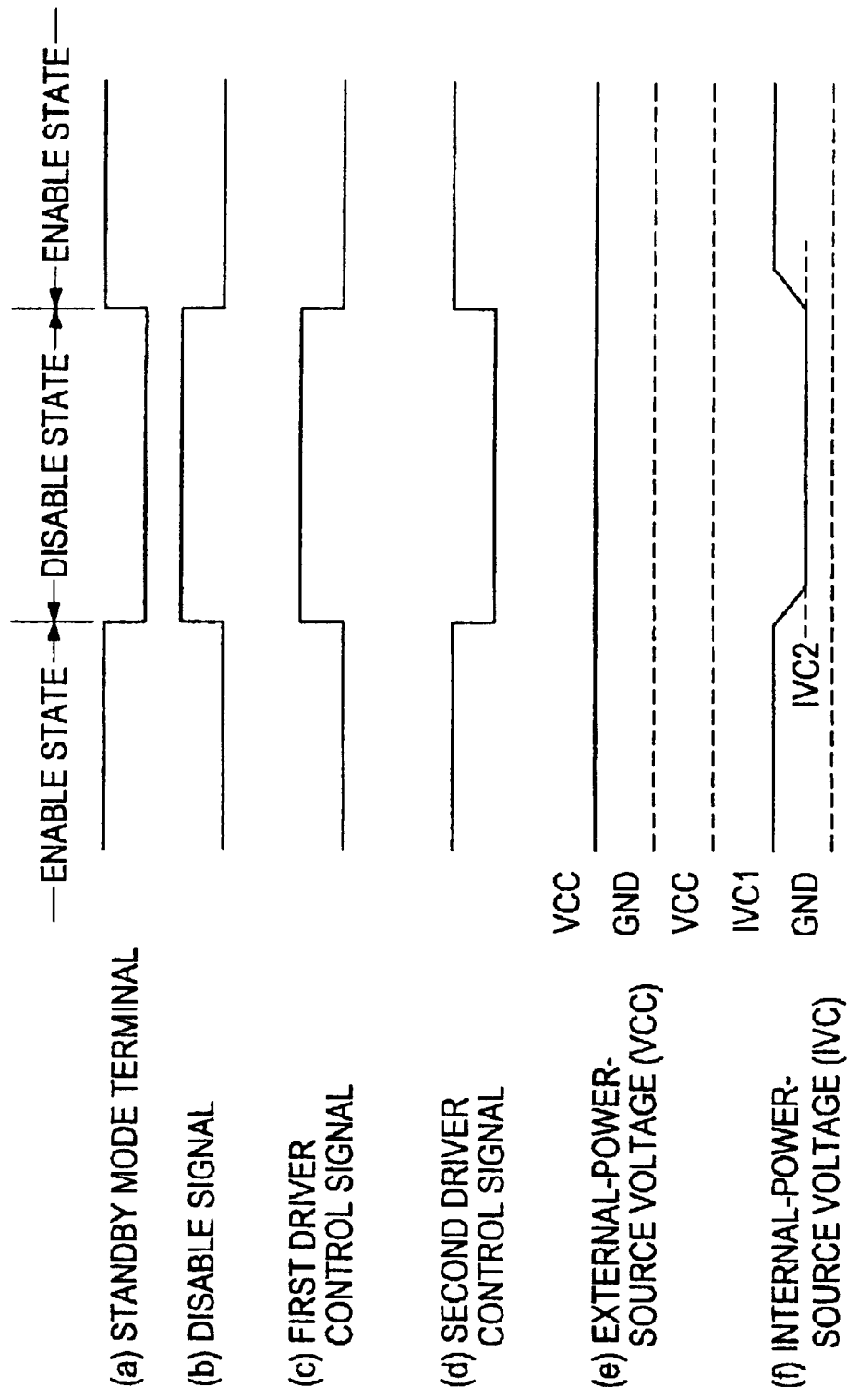
FIGS. 9(a) to 9(f) are waveform diagrams showing operations of a DRAM power-source controller.
Figure 10:
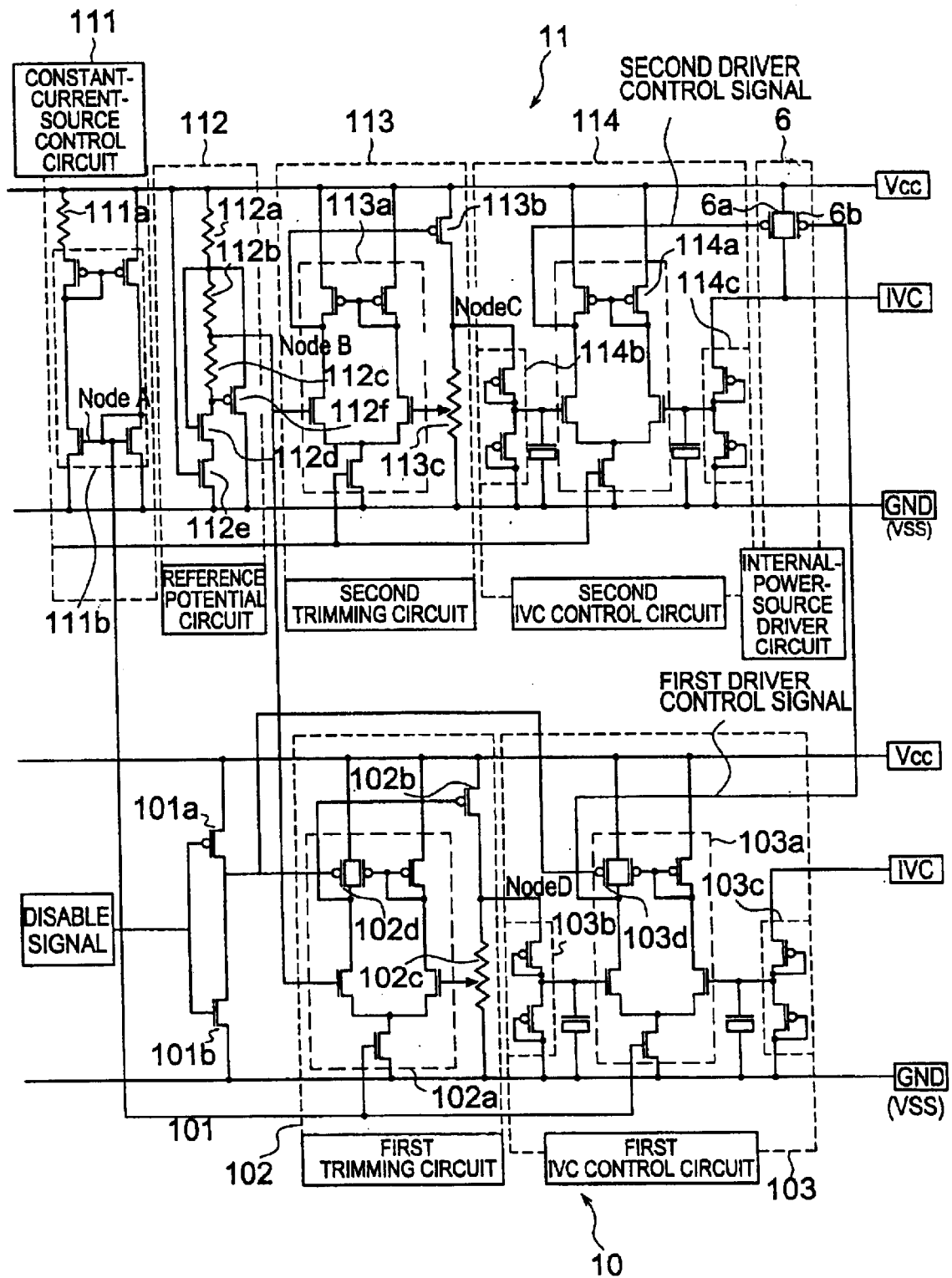
FIG. 10 is an illustration of first and second internal-power-source reference circuits and an internal-power-source driver circuit.

FIG. 8 is a block diagram showing a configuration of the DRAM power-source controller of the embodiment 3 of the present invention;

FIGS. 9(a) to 9(f) are waveform diagrams showing operations of the DRAM power-source controller; and FIG. 10 is an illustration of first and second internal-power-source reference circuits and an internal-power-source driver circuit.

A portion same as or corresponding to the portion of the embodiment 1 described for FIG. 1 is provided with the same symbol and its description is omitted.

The DRAM power-source controller shown in FIG. 8 is constituted by a mode detection circuit 4, an internal-power-source driver circuit 6, a first internal-power-source reference circuit 10, and a second internal-power-source reference circuit 11. The mode detection circuit 4 outputs an L-level disable signal under the enable state and inverts the disable signal into H-level under the disable state. The internal-power-source driver circuit 6 is constituted by Pch-Tr 6a and Pch-Tr 6b. The first internal-power-source reference circuit 10 controls the level of a first driver control signal to turn on Pch-Tr 6b when an L-level disable signal is input to supply an internal-power-source voltage IVC1 lower than an external-power-source voltage VCC to a peripheral circuit 21, memory cell 22, and internal voltage circuit 23, and inverts the first driver control signal into H-level to turn off Pch-Tr 6b when an H-level disable signal is input. The second internal-power-source reference circuit 11 sets a second driver control signal to H-level when Pch-Tr 6b is turned on to turn off Pch-Tr 6a, controls the level of the second driver control signal to turn on Pch-Tr 6a when Pch-Tr 6b is turned off, to supply an internal-power-source voltage IVC2 lower than the internal-power-source voltage IVC1 to the peripheral circuit 21, memory cell 22, and internal voltage circuit 23.

As shown in FIG. 10, the above-described internal-power-source reference circuit 10 is constituted by an inverter 101, a first trimming circuit 102, and a first IVC control circuit 103.

The inverter 101 is constituted by Pch-Tr 101a whose drain is connected to the external-power-source voltage VCC, whose gate is connected to the output side of the mode detection circuit 4, and whose source is connected to the output side of this inverter 101 and Nch-Tr 101b whose drain is connected to the source of Pch-Tr 101a, whose gate is connected to the gate of Pch-Tr 101a, and whose source is connected to the GND (VSS). Moreover, the inverter 101 sets an output to H-level when an L-level disable signal is input (enable state) and inverts the output into L-level when an H-level disable signal is input (disable state).

The first trimming circuit 102 is constituted by a differential amplifier 102a using a constant current generated at NodeA of a constant-current-source control circuit 111 to be described later as a power source for a bias, Pch-Tr 102b whose gate is connected to the output side of the differential amplifier 102a and whose drain is connected to the external-power-source voltage VCC and a resistive element 102c whose one end is connected to the source of Pch-Tr 102b and whose other end is connected to the GND. Moreover, because Pch-Tr 102d of the differential amplifier 102a is turned off when an output of the inverter 101 is kept H-level (enable state), the circuit 102 compares the reference potential generated at NodeB of a reference potential circuit 112 with an optional point of a resistive element 102c and outputs a potential amplified in accordance with a resistance distribution ratio from NodeD of the connection point between Pch-Tr 102b and resistive element 102c. Then, because Pch-Tr 102d of the differential amplifier 102a is turned on when an output of the inverter 101 is kept L-level (disable state), the output becomes H-level and Pch-Tr 102b is turned off, and thereby NodeD is set to L-level.

The first IVC control circuit 103 is constituted by a differential amplifier 103a using a constant current generated at NodeA of the constant-current-source control circuit 111 as a power source for a bias, a first half-value circuit 103b having Pch-Tr and Mos-Tr connected between NodeD of the first trimming circuit 102 and the GND in series to set a potential generated at the above NodeD to ½ level, and a second half-value circuit 103c having Pch-Tr and Mos-Tr connected between the internal-power-source voltage IVC1 and the GND in series to set the internal power-source voltage IVC1 to ½ level. Moreover, because Pch-Tr 103d of the differential amplifier 103a is turned off when an output of the inverter 101 is kept H-level (enable state), a first driver control signal is generated by the differential amplifier 103a to control Pch-Tr 6b in order to obtain the internal-power-source voltage IVC1 (<VCC) decided in accordance with the output level of the first half-value circuit 103b. Moreover, because Pch-Tr 130d of the differential amplifier 103a is turned on because an output of the a first half-value circuit 103b is kept L-level when an output of the inverter 101 is kept L-level (disable state), the first driver control signal is set to H-level to turn off Pch-Tr 6ab.

Moreover, the second internal-power-source reference circuit 11 is constituted by the constant-current-source control circuit 111, the reference potential circuit 112, a second trimming circuit 113, and a second IVC control circuit 114.

The constant-current-source control circuit 111 is constituted by a resistive element 11a and a current mirror circuit 111b to output a constant current generated at the gate connection point NodeA between a pair of Nch-Trs. The reference potential circuit 112 is constituted by resistive elements 112a, 112b, and 112c branched from the external-power-source voltage VCC and connected in series, Nch-Tr 112d whose drain is connected to the resistive element 112c and whose gate is connected to the resistive elements 112a and 112b, Nch-Tr 112e whose drain is connected to the source of Nch-Tr 112d, whose gate is connected to the external-power-source voltage VCC, and whose source is connected to the GND, and Pch-Tr 112f whose gate is connected to the drain of Nch-Tr 112d, whose drain is connected to the connection point between the resistive elements 112a and 112b, and whose source is connected to the GND and outputs a reference potential generated at the connection point NodeB between the resistive elements 112b and 112c.

The second trimming circuit 113 is constituted by a differential amplifier 113a using a constant current generated at NodeA of the constant-current-source control circuit 111 as a power source for a bias, Pch-Tr 113b whose gate is connected to the output side of the differential amplifier 113a and whose drain is connected to the external-power-source voltage VCC, and a resistive element 113c whose one end is connected to the source of Pch-Tr 113b and whose other end is connected to the GND, which compares a reference potential generated at NodeB of the reference potential circuit 112 with an optional point having a resistance distribution ratio of NodeD>NodeC and outputs a potential amplified in accordance with the resistance distribution ratio from the connection point NodeC between Pch-Tr 113b and resistive element 113c.

The second IVC control circuit 114 is constituted by a differential amplifier 114a using a constant current generated at NodeA of the constant-current-source control circuit 111 as a power source for a bias, a first half-value circuit 114b having Pch-Tr and Mos-Tr connected between NodeC of the second trimming circuit 113 and the GND in series to set a potential generated at the above NodeC to ½ level, and a second half-value circuit 114c having Pch-Tr and Mos-Tr connected between the internal-power-source voltage IVC1 and the GND in series to set the internal IVC1 to ½ level. Moreover, because the output level of the second half-value circuit 114c becomes sufficiently higher than the output level of the first half-value circuit 114b when Pch-Tr 6b of the internal-power-source driver circuit 6 is turned on, the circuit 114 outputs an H-level second driver control signal from an output of the differential amplifier 114a to the internal-power-source driver circuit 6 to turn off Pch-Tr 6a. When Pch-Tr 6b is turned off, a second driver control signal is generated by the differential amplifier 114a to control Pch-Tr 6a in order to obtain the internal-power-source voltage IVC2 (<IVC1) to be decided in accordance with the output level of the first half-value circuit 114b after natural discharge of the peripheral circuit 21 due to junction leak or off-leak.

Then, operations of the embodiment 3 are described below by referring to the waveform diagrams shown in FIGS. 9(a) to 9(f).

When the standby mode terminal 3 is kept H-level (enable state)(refer to FIG. 9(a)), the mode detection circuit 4 generates an L-level disable signal by the input initial-stage circuit 42 and inverters 43 and 44 of two stages (refer to FIG. 9(b)) and outputs the signal to the first internal-power-source reference circuit 10. In the case of the first internal-power-source reference circuit 10, when the L-level disable signal is input, the inverter 101 inverts the signal into H-level. Because Pch-Tr 102d of the differential amplifier 102a is turned off, the first trimming circuit 102 compares a reference potential generated at NodeB of the reference potential circuit 112 with an optional point of the resistive element 102 and outputs a potential amplified in accordance with a resistance distribution ratio from the connection point NodeD between Pch-Tr 102b and the resistive element 102c. Because Pch-Tr 103d of the differential amplifier 103a is turned off when an output of the inverter 101 is kept H-level, the first IVC control circuit 103 generates a first driver control signal by the differential amplifier 103a to control Pch-Tr 6b in order to obtain the internal power-source voltage IVC1 (<VCC) to be decided in accordance with the output level of the first half-value circuit 103b (refer to FIG. 9(c)). In this case, the internal-power-source voltage IVC1 lower than the external-power-source voltage VCC is applied to the peripheral circuit 21, memory cell 22, and internal voltage circuit 23 (refer to FIGS. 9(e) and (f)).

In the case of the second IVC control circuit 114 of the second internal-power-source reference circuit 11, because the output level of the second half-value circuit 114c becomes sufficiently higher than the output level of the first half-value circuit 114b when Pch-Tr 6b of the internal-power-source driver circuit 6 is turned on, an H-level second driver control signal is output from an output of the differential amplifier 114a (refer to FIG. 9(d)) to turn off Pch-Tr 6a of the internal-power-source driver circuit 6.

Moreover, when the standby mode terminal 3 becomes L-level (disable state) (refer to FIG. 9(a)), the mode detection circuit 4 inverts an L-level disable signal into H-level (refer to FIG. 9(b)) to output the H-level disable signal to the first internal-power-source reference circuit 10. When an H-level disable signal is input, the inverter 101 is inverted into L-level and Pch-Tr 102d of the differential amplifier 102a is turned on. Therefore, an output of the first trimming circuit 102 becomes H-level to set NodeD to L-level. Because an output of the first half-value circuit 103b is kept L-level and Pch-Tr 130d of the differential amplifier 103a is turned on in accordance with an output (L-level) of the inverter 101, the first IVC control circuit 103 inverts a first driver control signal into H-level (refer to FIG. 9(c)) and turns off Pch-Tr 6b of the internal-power-source driver circuit 6.

When Pch-Tr 6b is turned off, the second IVC control circuit 114 of the second internal-power-source reference circuit 11 generates a second driver control signal by the differential amplifier 114a in order to obtain the internal-power-source voltage IVC2 (<IVC1) to be deiced in accordance with the output level of the first half-value circuit 114b after natural discharge due to junction leak or off-leak of the peripheral circuit 21 (refer to FIG. 9(d)) to control Pch-Tr 6a of the internal-power-source driver circuit 6. In this case, the IVC2 lower than the internal-power-source voltage IVC1 is applied to the peripheral circuit 21, memory cell 22, and internal voltage circuit 23 (refer to FIGS. 9(e) and 9(f)).

As described above, the embodiment 3 is provided with:
the mode detection circuit 4 for outputting an L-level disable signal under the enable state and inverting the L-level disable signal into H-level under the disable state;

the internal-power-source driver circuit 6 constituted by Pch-Tr 6a and Pch-Tr 6b;

the first internal-power-source reference circuit 10 for controlling the level of a first driver control signal to turn on Pch-Tr 6b when a L-level disable signal is input, supplying the internal-power-source voltage IVC1 lower than the external-power-source voltage VCC to the peripheral circuit 21, memory cell 22, and internal voltage circuit 23, and inverting the first driver control signal into H-level to turn off Pch-Tr 6b when an H-level disable signal is input; and the second internal-power-source reference circuit 11 for setting a second driver control signal to H-level to turn off Pch-Tr 6a when Pch-Tr 6b is turned on, controlling the level of the second driver control signal to turn on Pch-Tr 6a when Pch-Tr 6b is turned off, and supplying the internal-power-source voltage IVC2 lower than the internal-power-source voltage IVC1 to the peripheral circuit 21, memory cell 22, and internal voltage circuit 23. Therefore, it is possible to reduce the current consumption not only under the disable state but also under the enable state.

Embodiment 4

Figure 11:
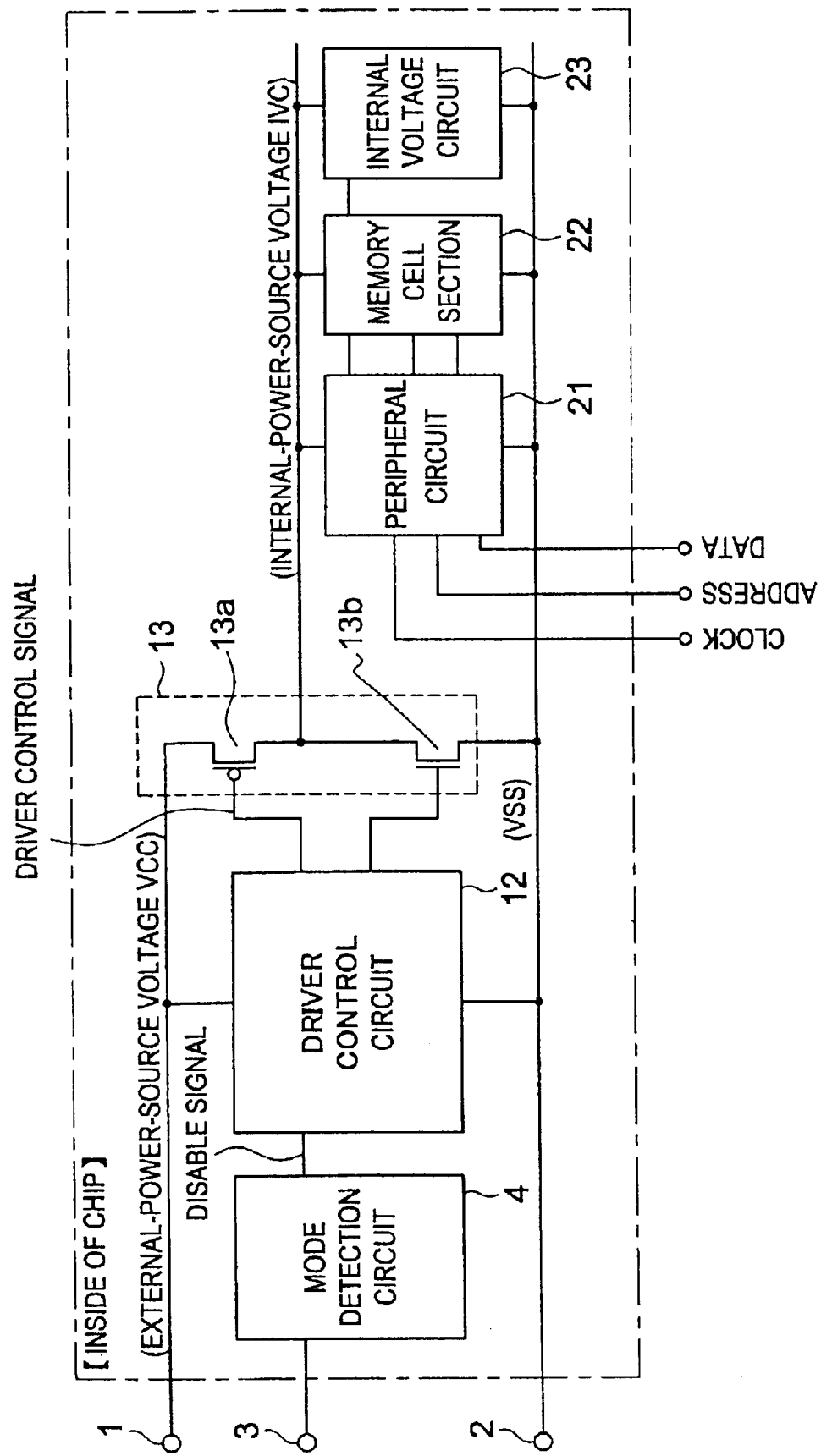
FIG. 11 is a block diagram showing a configuration of a DRAM power-source controller of embodiment 4 of the present invention.
Figure 12:
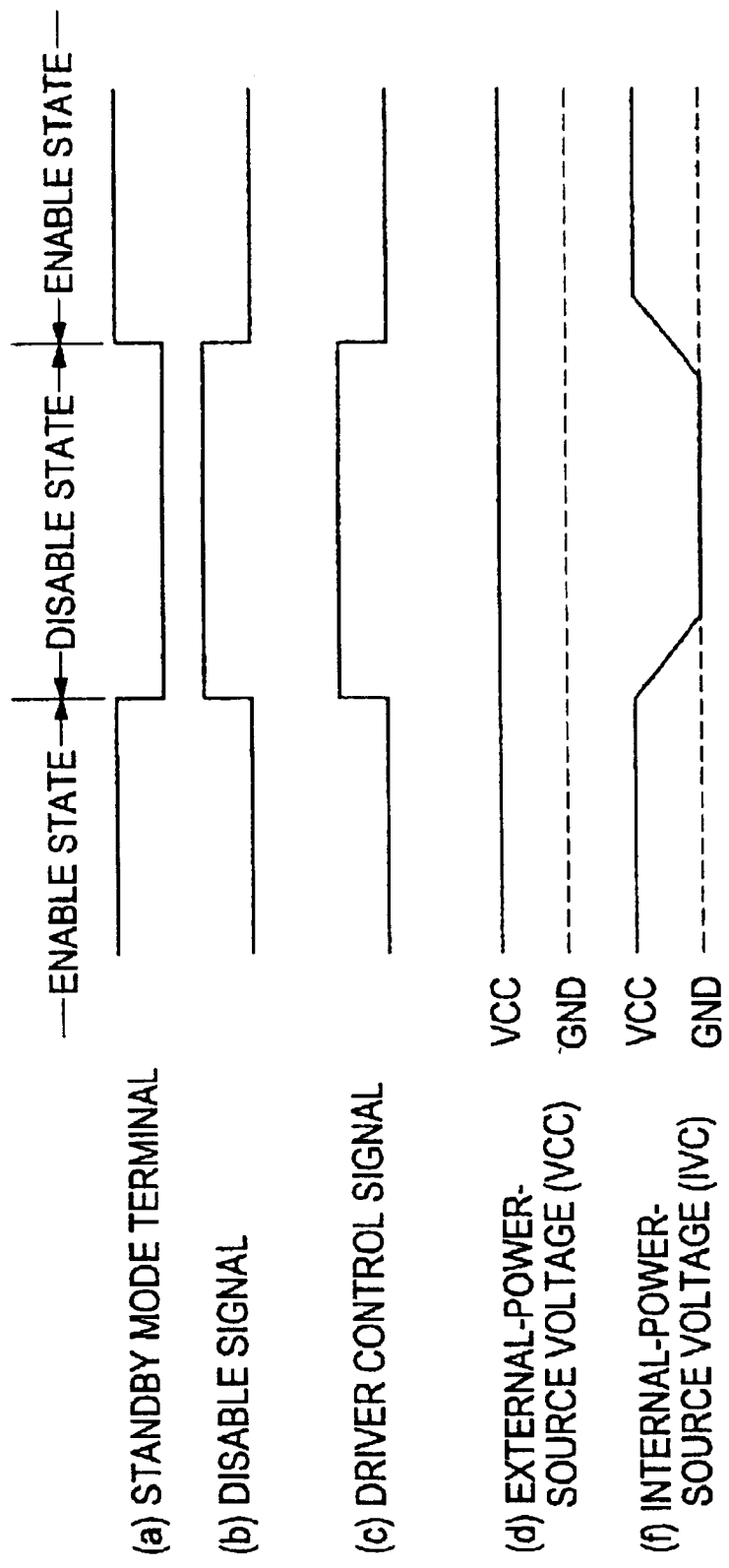
FIGS. 12(a) to 12(d) and 12(f) are waveform diagrams showing operations of a DRAM power-source controller.
Figure 13:
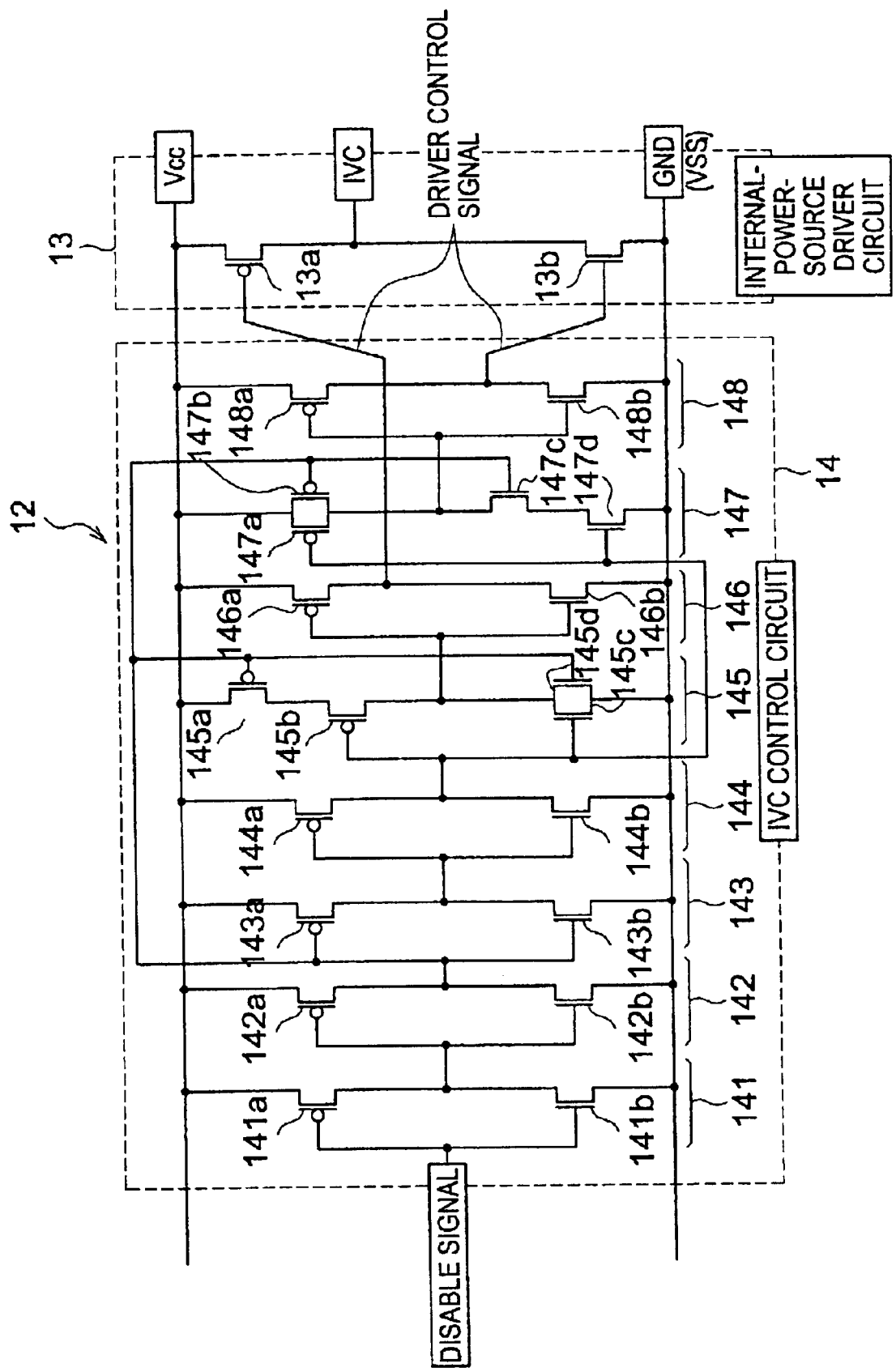
FIG. 13 is an illustration of a driver control circuit and an internal-power-source driver circuit.

FIG. 11 is a block diagram showing a configuration of the DRAM power-source controller of the embodiment 4 of the present invention, FIGS. 12(a) to 12(f) are waveform diagrams showing operations of the DRAM power-source controller, and FIG. 13 is an illustration of a driver control circuit and an internal-power-source driver circuit. A portion same as that of the embodiment 1 described for FIGS. 1 and 3 is provided with the same symbol and its description is omitted.

The DRAM power-source controller shown in FIG. 11 is constituted by a mode detection circuit 4, driver control circuit 12, and internal-power-source driver circuit 13. The mode detection circuit 4 outputs an L-level disable signal under the enable state and inverts the L-level disable signal into H-level under the disable state. The driver control circuit 12 sets a pair of driver control signals to L-level when an L-level disable signal is input and inverts the driver control signals into H-level when an H-level disable signal is input. The internal-power-source driver circuit 13 supplies an external-power-source voltage VCC to a peripheral circuit 21, memory cell, and internal voltage circuit 23 as an internal-power-source voltage IVC because Nch-Tr 13b is turned off and Pch-Tr 13a is turned on when an L-level driver control signal is input and sets the internal-powersource voltage IVC to the GND level (VSS) because Pch-Tr 13a is turned off and Nch-Tr 13b is turned on when an H-level driver control signal is input.

The above-described driver control circuit 12 is constituted by an IVC control circuit 14 as shown in FIG. 13.

The IVC control circuit 14 comprises;
a first inverter 141 for using a disable signal output from the mode detection circuit 4 as an input to Pch-Tr 141a and Nch-Tr 141b,
a second inverter 142 using a signal output from the first inverter 141 as an input to Pch-Tr 142a and Nch-Tr 142b,
a third inverter 143 using a signal output from the second inverter 142 as an input to to Pch-Tr 143a and Nch-Tr 143b,
a fourth inverter 144 using a signal output from the third inverter 143 as an input to Pch-Tr 144a and Nch-Tr 144b,
a NOR circuit 145 using signals output from the second inverter 142 and fourth inverter 144 as inputs to Pch-Trs 145a and 145b and Nch-Trs 145c and 145d,
a fifth inverter 146 using a signal output from the NOR circuit 145 as an input to Pch-Tr 146a and Nch-Tr 146b,
a NAND circuit 147 using signals output from the second inverter 142 and fourth inverter 144 as inputs to Pch-Trs 147a and 147b and Nch-Trs 147c and 147d, and
a sixth inverter 148 using a signal output from the NAND circuit 147 as input to Pch-Tr 148a and Nch-Tr 148b.

The internal-power-source driver circuit 13 is constituted by Pch-Tr 13a whose drain is connected to the external-power-source voltage VCC, whose gate is connected to the output side of the fifth inverter 146 of the IVC control circuit 14, and whose source is connected to the internal-power-source voltage IVC and Nch-Tr 13b whose drain is connected to the internal-power-source voltage IVC, whose gate is connected to the output side of the sixth inverter 148, and whose source is connected to the GND.

Then, operations of the embodiment 4 are described below by referring to the waveform diagrams shown in FIGS. 12(a) to 12(f).

When a standby mode terminal 3 is kept H-level (enable state) (refer to FIG. 12(a)), the mode detection circuit 4 generates an L-level disable signal by an input initial-stage circuit 42 and the first and second inverters 43 and 44 of two stages (refer to FIG. 12(b)) and outputs the signal to the first inverter 141 of the IVC control circuit 14. In this case, because an output of the front-stage NAND circuit 147 becomes H-level, Pch-Tr 148a is turned off and Nch-Tr 148b is turned on, the sixth inverter 148 sets a driver control signal to L-level (refer to FIG. 12(c)) to turn off Nch-Tr 13b of the internal-power-source driver circuit 13. Moreover, because an output of the front-stage NOR circuit 145 becomes H-level, Pch-Tr 146a is turned off and Nch-Tr 146b is turned on and the fifth inverter 146 sets a driver control signal to L-level (refer to FIG. 12(c)), turns on Pch-Tr 13a of the internal-power-source driver circuit 13, and supplies the external-power-source voltage VCC to the peripheral circuit 21, memory cell 22, and internal voltage circuit 23 as the internal-power-source voltage IVC (refer to FIGS. 12(d) and 12(e)). Pch-Tr 13a of the internal-power-source driver circuit 13 is turned after the delay time by the third and fourth inverters.

When the standby mode terminal 3 becomes L-level (disable state) (refer to FIG. 12(a)), the mode detection circuit 4 inverts an L-level disable signal into H-level (refer to FIG. 12(b)) and outputs the H-level disable signal to the first inverter 141 of the IVC control circuit 14. In this case, because an output of the front-stage NOR circuit 145 becomes L-level, Pch-Tr 146a is turned on and Nch-Tr 146b is turned off and the fifth inverter 146 sets a driver control signal to H-level (refer to FIG. 12(c)) and turns off Pch-Tr 13a of the internal-power-source driver circuit 13. Moreover, because an output of the front-stage NAND circuit 147 becomes L-level, Pch-Tr 148a is turned on and Nch-Tr 148b is turned off and the sixth inverter 148 sets a driver control signal to H-level (refer to FIG. 12(c)), turns on Nch-Tr 13b of the internal-power-source driver circuit 13 and sets the internal-power-source voltage IVC to the GND level (refer to FIGS. 12(d) and 12(e)).

As described above, the embodiment 4 is provided with:
the driver control circuit 12 for outputting an L-level driver control signal when the standby mode terminal 3 is kept H-level (enable state) and outputting an H-level driver control signal when the standby mode terminal 3 is kept L-level (disable state); and
the internal-power-source driver circuit 13 for supplying the external-power-source voltage VCC to the peripheral circuit 21, memory cell 22, and internal voltage circuit 23 as the internal-power-source voltage IVC when an L-level driver control signal is input and setting the internal-power-source voltage IVC to the GND level (VSS) when an H-level driver control signal is input. Therefore, it is possible to reduce a standby current under the disable state and suppress power consumption without fluctuating the voltage of the external-power-source voltage VCC.

Moreover, because Nch-Tr 13b of the internal-power-source driver circuit 13 is turned on to set the internal-power-source voltage IVC to the GND level (VSS) under the disable state, it is possible to completely cut off the current circulating between VCC and GND due to defects of a step-up circuit and the memory cell 22.

Embodiment 5

Figure 14:
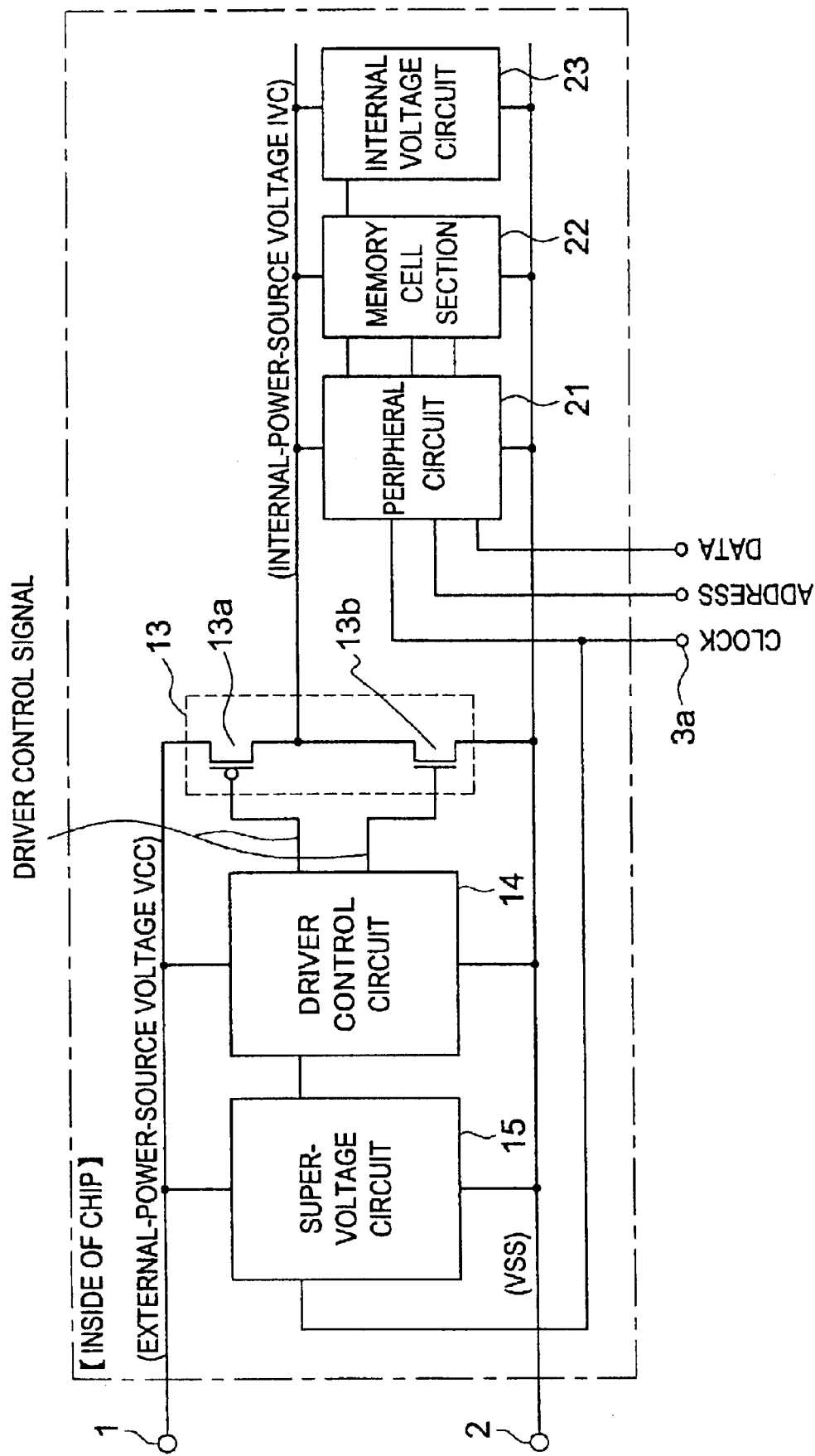
FIG. 14 is a block diagram showing a configuration of a DRAM power-source controller of embodiment 5 of the present invention.
Figure 15:
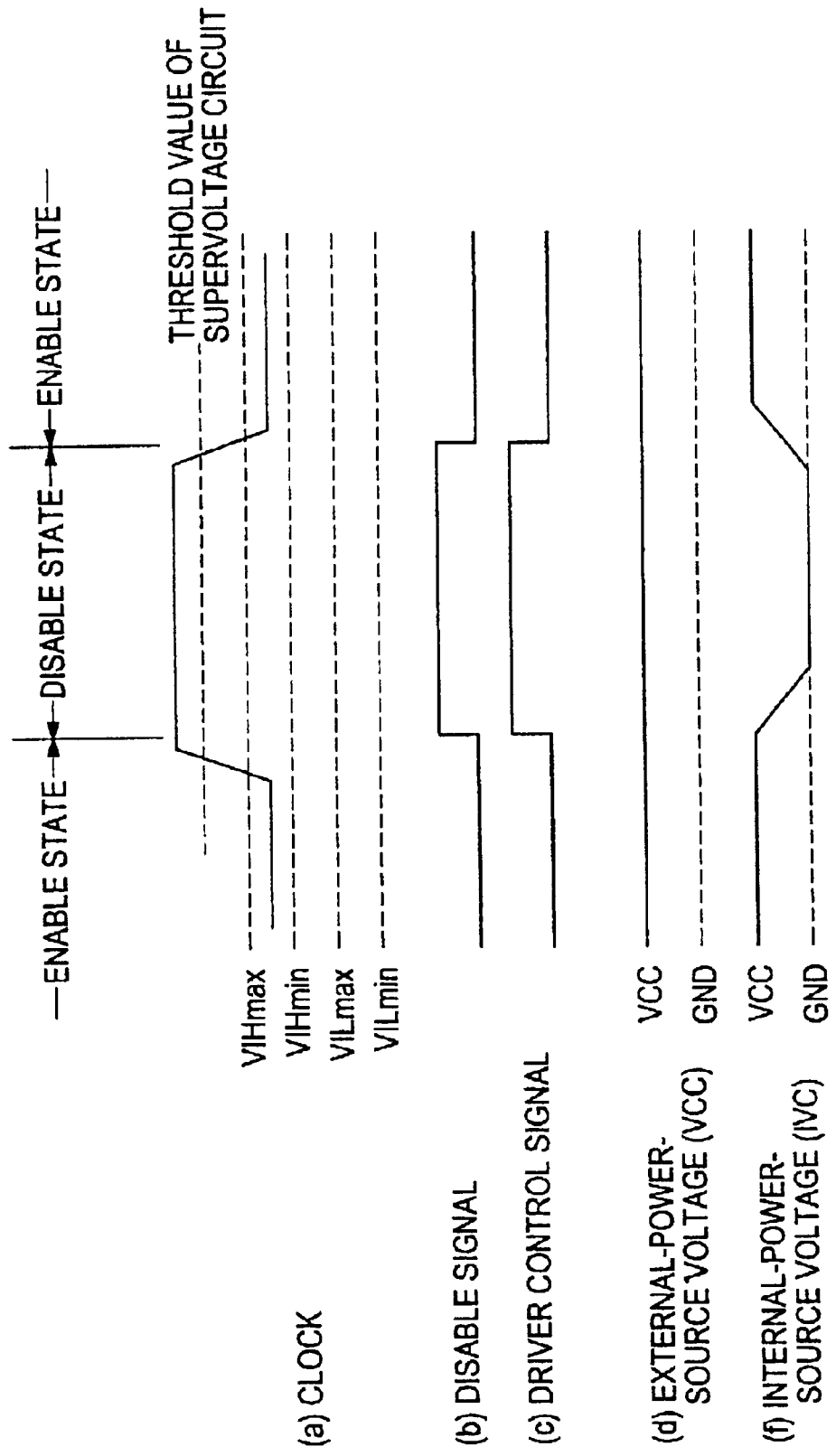
FIGS. 15(a) to 15(d) and 15(f) are waveform diagrams showing operations of a DRAM power-source controller.
Figure 16:
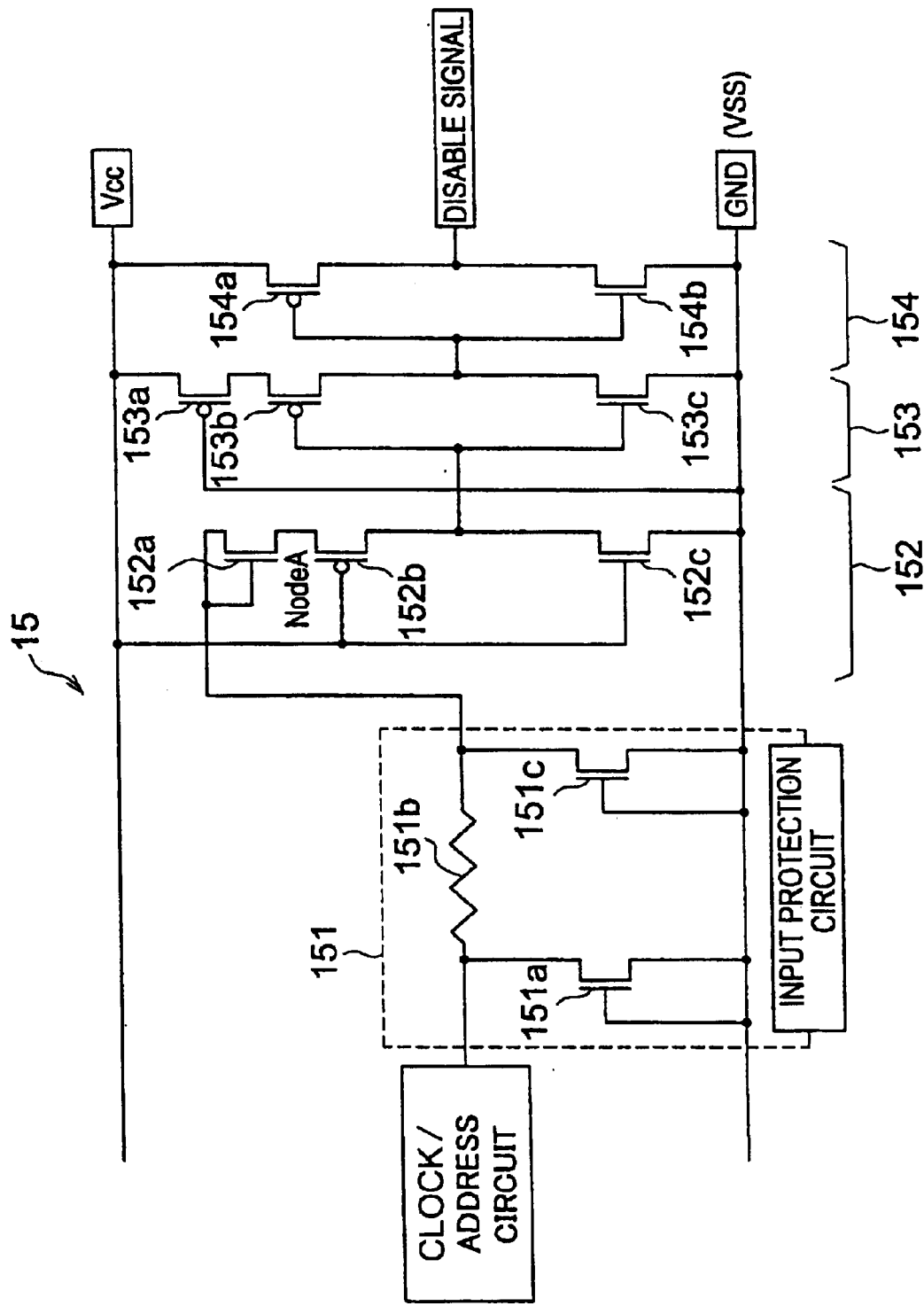
FIG. 16 is an illustration of a supervoltage circuit.

FIG. 14 is a block diagram showing a configuration of the DRAM power-source controller of the embodiment 5 of the present invention;

FIGS. 15(a) to 15(f) are waveform diagrams showing operations of a DRAM power-source controller; and FIG. 16 is an illustration of a supervoltage circuit.

A portion same as or corresponding to that of the embodiment 4 described for FIGS. 11 and 13 is provided with the same symbol and its description is omitted.

The DRAM power-source controller shown in FIG. 14 is constituted by a supervoltage circuit 15, a driver control circuit 14, and an internal-power-source driver circuit 13. The supervoltage circuit 15 outputs an L-level disable signal when the level of a clock input through a clock terminal 3a is lower than a predetermined threshold value (enable state) and outputs an H-level disable signal when the level of the clock is equal to or higher than the above threshold value (disable state). The driver control circuit 14 outputs an L-level driver control signal when an L-level disable signal is input and outputs an H-level driver control signal when an H-level disable signal is input. The internal-power-source driver circuit 13 supplies the external-power-source voltage VCC to the peripheral circuit 21, memory cell 22, and internal voltage circuit 23 as the internal-power-source voltage IVC because Nch-Tr 13b is turned off and Pch-Tr 13a is turned on when an L-level driver control signal is input and sets the internal-power-source voltage IVC to the GND level (VSS) when an H-level driver control signal is input because Pch-Tr 13a is turned off and Nch-Tr 13b is turned on.

As shown in FIG. 16, the above supervoltage circuit 15 is constituted by an input protection circuit 151, a supervoltage initial-stage circuit 152, a first inverter 153, and a second inverter 154. The input protection circuit 151 is constituted by Nch-Tr 151a whose drain is connected to a clock terminal 3a at the input side and whose gate and source are connected to the GND, a resistive element 151b whose one end is connected to the clock terminal 3a and whose other end is connected to the output side of this circuit 151, and Nch-Tr 151c whose drain is connected to the other end of the resistive element 151b and whose gate and source are connected to the GND.

The supervoltage initial-stage circuit 152 is constituted by Nch-Tr 152a whose drain and gate are connected to the output side of the input protection circuit 151, Pch-Tr 152b whose drain is connected to the source of Nch-Tr 152a, whose gate is connected to the external-power-source voltage VCC and whose source is connected to the output side of this circuit 152, and Nch-Tr 152c whose drain is connected to the source of Pch-Tr 152b, whose gate is connected to the external-power-source voltage VCC, and whose source is connected to the GND. Moreover, when the level of a clock input through the input protection circuit 151 is lower than a threshold value which is the operating point (VCC+Vtp+Vtn) of Nch-Tr 152a and Pch-Tr 152b, only Nch-Tr 152c is turned on to set an output to L-level. When the level of the above clock is equal to or higher than the threshold value of Nch-Tr 152a and Pch-Tr 152b, an output is set to H-level.

The first inverter 153 is constituted by Pch-Tr 153a whose drain is connected to the external-power-source voltage VCC and whose gate is connected to the GND, Pch-Tr 153b whose drain is connected to the source of Pch-Tr 153a, whose gate is connected to the output side of the supervoltage initial-stage circuit 152, and whose source is connected to the output side of this inverter 153, and Nch-Tr 153c whose drain is connected to the source of Pch-Tr 153b, whose gate is connected to the gate of Pch-Tr 153b, and whose source is connected to the GND. Moreover, when an input from the supervoltage initial-stage circuit 152 is kept L-level (enable state), Pch-Tr 153b is turned on to set the output to H-level. When the above input is kept H-level (disable state), only Nch-Tr 153c is turned to set the output to L-level.

The second inverter 154 is constituted by Pch-Tr 154a whose drain is connected to the external-power-source voltage VCC, whose gate is connected to the output side of the first inverter 153, and whose source is connected to the output side of this inverter 154 and Nch-Tr 154b whose drain is connected to the source of Pch-Tr 154a, whose gate is connected to the gate of Pch-Tr 154a, and whose source is connected to the GND. Moreover, when an input from the first inverter 153 is kept H-level, Nch-Tr 154b is turned on to output an L-level disable signal (enable state). When the above input is kept L-level, Pch-Tr 154a is turned on to output an H-level disable signal (disable state).

Moreover, the driver control circuit 14 comprises the same configuration as the IVC control circuit shown in FIG. 13, which outputs an L-level driver control signal to the internal-power-source driver circuit 13 when a disable signal output from the second inverter 154 is kept L-level (enable state), turns off Nch-Tr 13b, turns on Pch-Tr 13a and sets the external-power-source voltage VCC to the internal-power-source voltage IVC. When the disable signal output from the second inverter 154 is kept H-level (disable state), the circuit 14 outputs an H-level driver control signal, turns off Pch-Tr 13a, turns on Nch-Tr 13b, and sets the internal power-source voltage IVC to the GND level (VSS).

Then, operations of the embodiment 5 are described below by referring to waveform diagrams shown in FIGS. 15(a) to 15(f).

When a clock (disable state) having a level in an H-level input voltage range (VIHmax to VIHmin) of a DRAM is input to the clock terminal 3a (refer to FIG. 15(a)), the supervoltage circuit 15 inputs the clock through the input protection circuit 151. Because the level of the clock is lower than the threshold value (operating point: VCC+Vtp+Vtn) of Nch-Tr 152a and Pch-Tr 152b of the supervoltage initial-stage circuit 152, only Nch-Tr 152c is turned on to set an output to L-level. In this case, the first inverter 153 inverts the level into H-level and moreover, the second inverter 154 inverts an output of the first inverter 153 into L-level and outputs the L-level output to the driver control circuit 14 as a disable signal (refer to FIG. 15(b)).

When an L-level disable signal in input (enable state), the driver control circuit 14 generates an L-level driver control signal (refer to FIG. 15(c)) and outputs the signal to Pch-Tr 13a and Nch-Tr 13b of the internal-power-source driver circuit 13. In this case, Nch-Tr 13b is turned off, Pch-Tr 13a is turned on, and the circuit 14 supplies the external-power-source voltage VCC to the peripheral circuit 21, memory cell 22, and internal voltage circuit 23 as the internal-power-source voltage IVC (refer to FIGS. 15(d) and 15(e)).

Moreover, when a clock (disable state) having a level equal to or wider than an H-level input-voltage range (VIHmax or more) of a DRAM is input to the input protection circuit 151 of the supervoltage circuit 15 through the clock terminal 3a (refer to FIG. 15(a)), an output is set to H-level when the level of the clock is equal to or higher than the threshold value of Nch-Tr 152a and Pch-Tr 152b of the supervoltage initial-stage circuit 152. In this case, the first inverter 153 inverts the level into L-level and moreover, the second inverter 154 inverts an output of the first inverter 153 into H-level and outputs the H-level output to the driver control circuit 14 as a disable signal (refer to FIG. 15(b)).

When an H-level disable signal is input (disable state), the driver control circuit 14 generates an H-level driver control signal (refer to FIG. 15(c)) and outputs the H-level driver control signal to Pch-Tr 13a and Nch-Tr 13b of the internal-power-source driver circuit 13. In this case, Pch-Tr 13a is turned off and Nch-Tr 13b is turned on to set the internal-power-source voltage IVC to the GND level (VSS) (refer to FIGS. 15(d) and 15(e)).

As described above, this embodiment 5 is provided with:
  the supervoltage circuit 15 for outputting an L-level disable signal when the level of a clock input through the clock terminal 3a is lower than the threshold value of Nch-Tr 152a and Pch-Tr 152b (enable state) and outputting an H-level disable signal when the level of the clock is equal to or higher than the threshold value (disable state);
  the driver control circuit 14 for outputting an L-level driver control signal when an L-level disable signal is input and outputting an H-level driver control signal when an H-level disable signal is input; and
  the internal-power-source driver circuit 13 for supplying the external-power-source voltage VCC to the peripheral circuit 21, memory cell 22, and internal voltage circuit 23 as the internal-power-source voltage IVC when an L-level driver control signal is input and setting the internal-power-source voltage IVC to the GND level (VSS) when an H-level driver control signal is input.

Therefore, it is possible to reduce a standby current under the disable state and suppress power consumption without fluctuating the voltage of the external-power-source voltage VCC. Moreover, by using the built-in supervoltage circuit 15, it is possible to separately use the standby state of a DRAM in the disable state and enable state only by applying a supervoltage to the clock terminal 3a without adding a signal to be applied to the standby mode terminal 3 like the case of the above embodiment.

Embodiment 6

Figure 17:
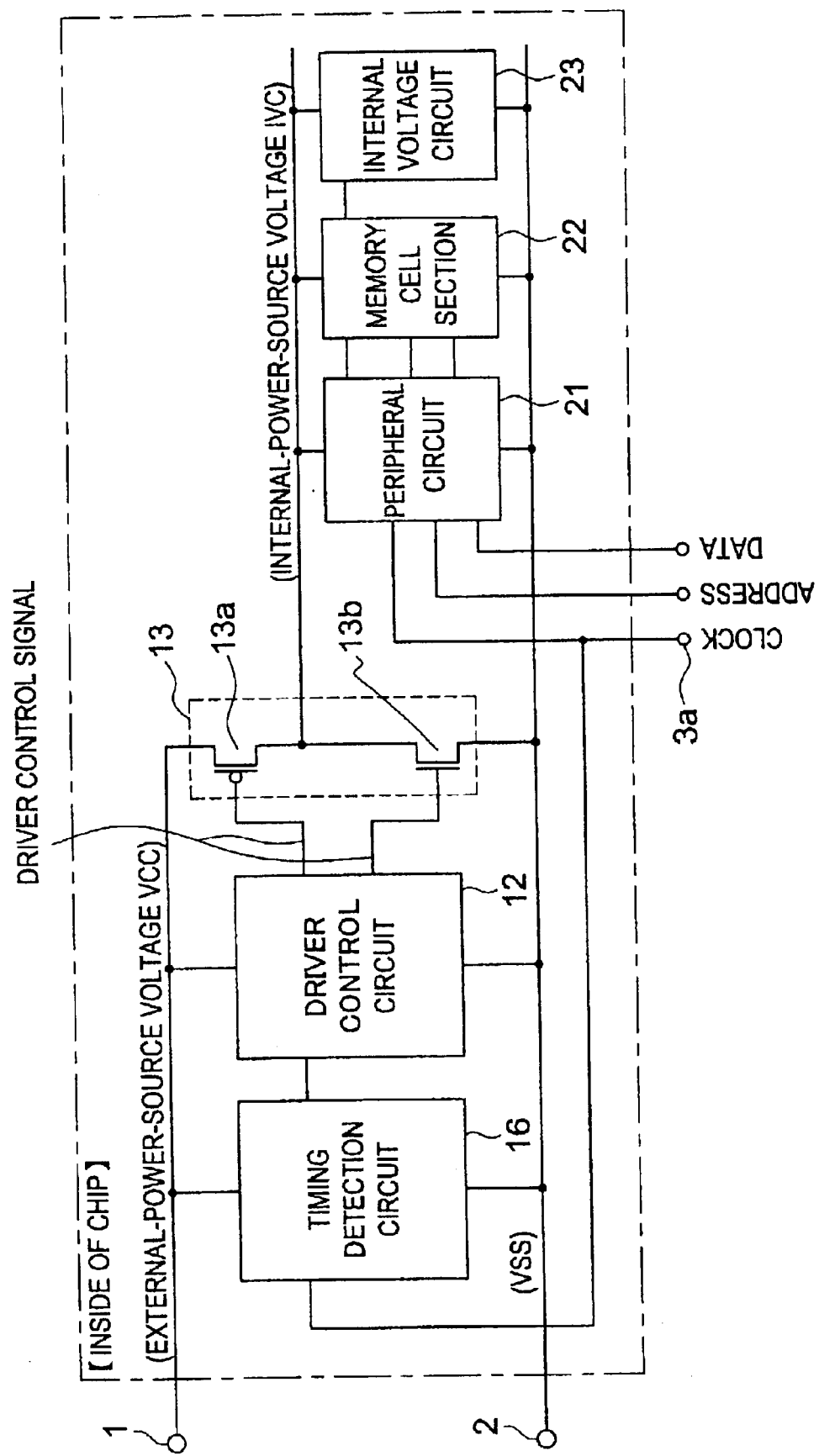
FIG. 17 is a block diagram showing a configuration of a DRAM power-source controller of embodiment 6 of the present invention.
Figure 18:
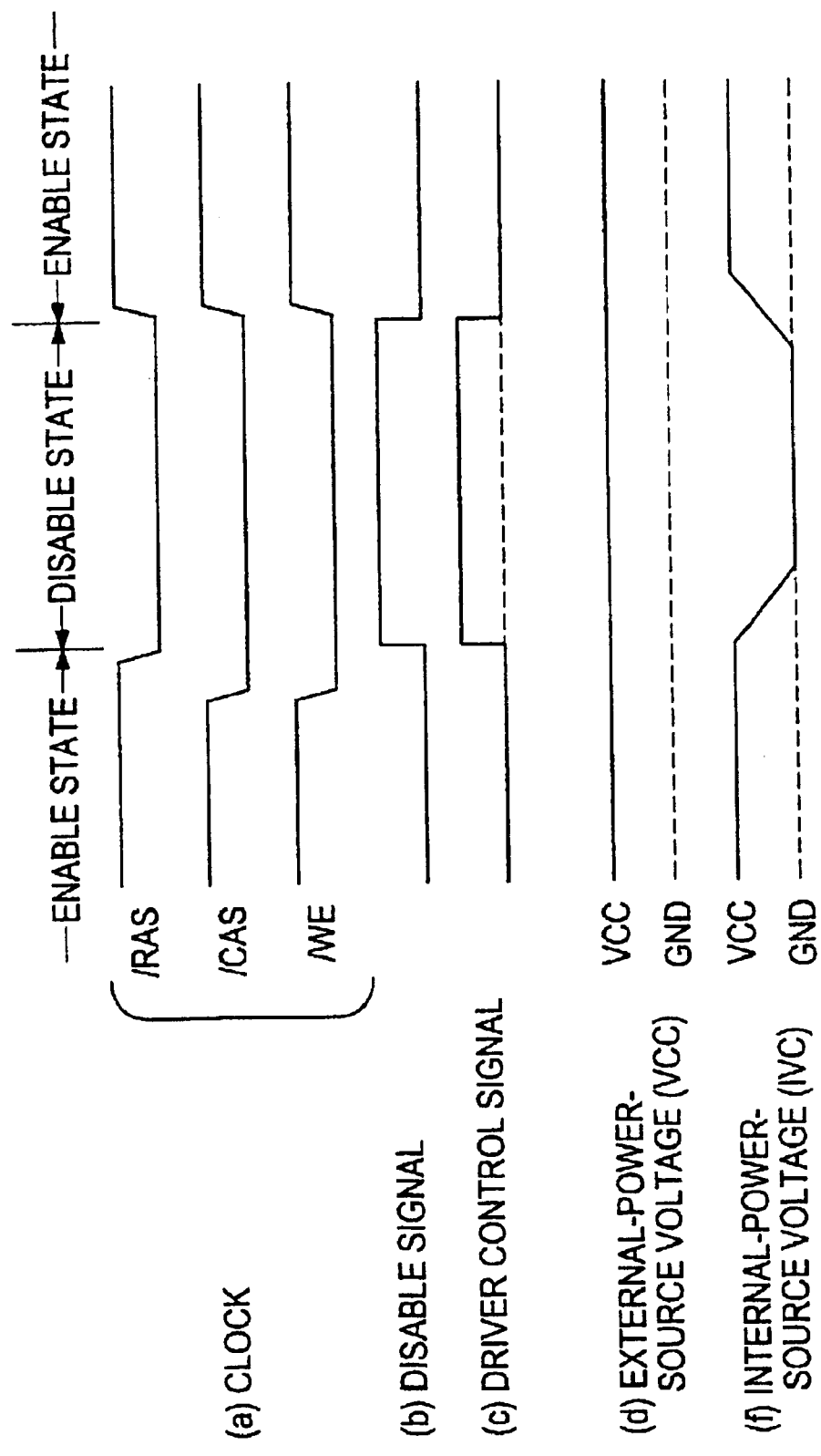
FIGS. 18(a) to 18(d) and 18(f) are waveform diagrams showing operations of a DRAM power-source controller.
Figure 19:
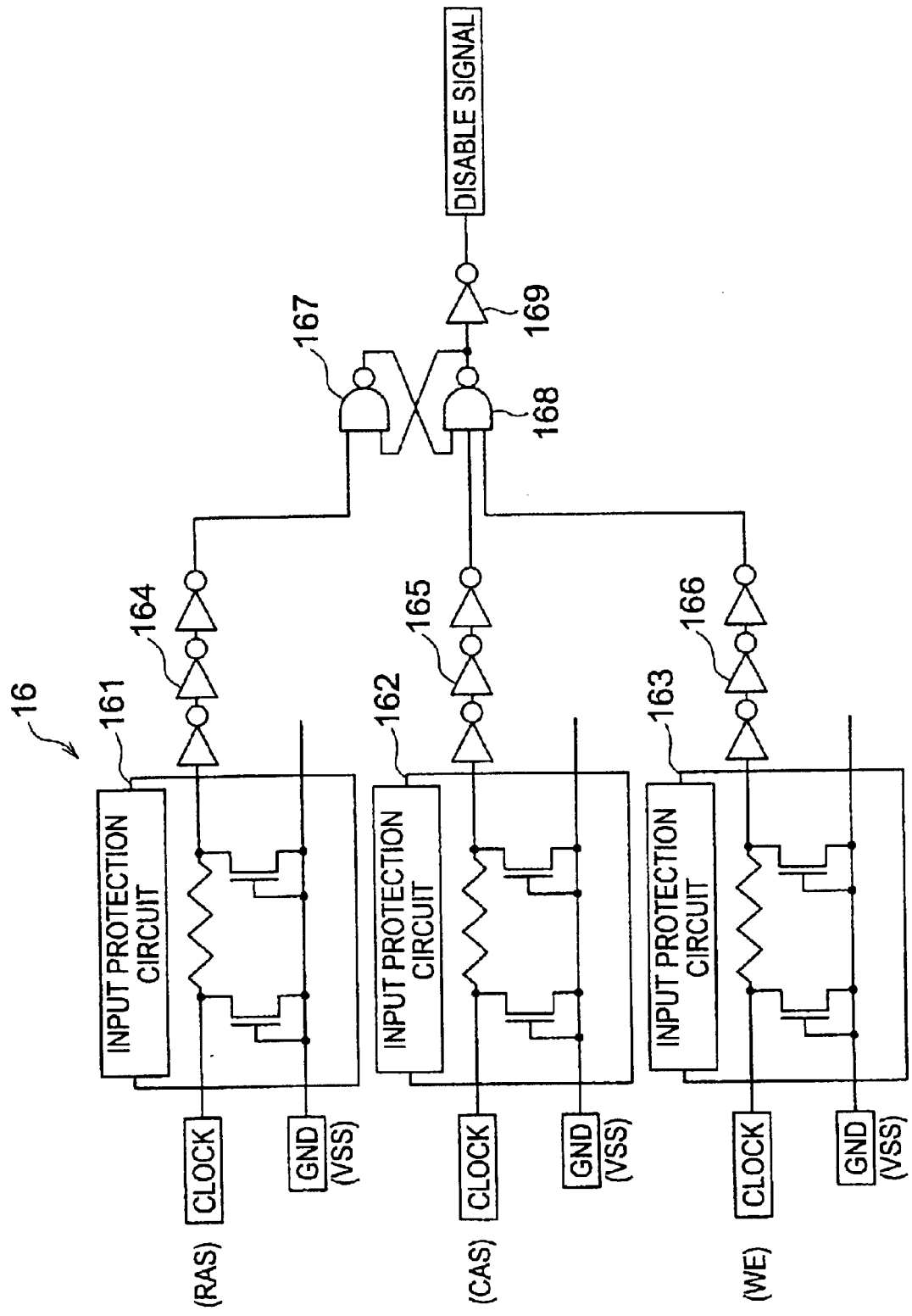
FIG. 19 is an illustration of a timing detection circuit.

FIG. 17 is a block diagram showing a configuration of the DRAM power-source controller of the embodiment 6 of the present invention;

FIGS. 18(*a*) to 18(*f*) are waveform diagrams showing operations of a DRAM power-source controller; and FIG. 19 is an illustration of a timing detection circuit.

A portion same as or corresponding to the portion the embodiment 4 described for FIGS. 11 and 13 is provided with the same symbol and its description is omitted.

The DRAM power-source controller shown in FIG. 17 is constituted by a timing detection circuit 16, a driver control circuit 12, and an internal-power-source driver circuit 13. The timing detection circuit 16 outputs an L-level disable signal when time-division clocks (RAS, CAS, and WE) input through the clock terminal 3a are kept H-level (enable state) and inverts the L-level disable signal into H-level when CAS and WE become L-level while RAS is kept H-level (disable state). The driver control circuit 12 outputs an L-level driver control signal when an L-level disable signal is input and outputs an H-level driver control signal when an H-level disable signal is input. The internal-power-source driver circuit 13 supplies the external-power-source voltage VCC to the peripheral circuit 21, memory cell 22, and internal voltage circuit 23 as the internal-power-source voltage IVC because Nch-Tr 13b is turned off and Pch-Tr 13a is turned on when the L-level driver control signal is input and sets the internal-power-source voltage IVC to the GND level (VSS) because Pch-Tr 13a is turned off and Nch-Tr 13b is turned on when the H-level driver control signal is input.

The timing detection circuit 16 described above is set to input protection circuits 161, 162, and 163 provided correspondingly to clocks (RAS, CAS, and WE) and output sides of input protection circuits 161, 162, and 163. For example, the circuit 16 is constituted by input circuits 164, 165, and 166 comprising inverters of three stages, a first NAND circuit 167 set to the output side of the input circuit 164, a second NAND circuit 168 set to the output sides of the input circuits 165 and 166, and an inverter 169 set to the output side of the second NAND circuit 168. An output of the above first NAND circuit 167 is connected with the input side of the second NAND circuit 168 and an output of the second NAND circuit 168 is connected with input sides of the inverter 169 and first NAND circuit 167.

The input protection circuits 161, 162, and 163 have the same configuration as the input protection circuit 41 of the mode detection circuit 4 of the embodiment 1 described for FIG. 3. Moreover, the above-described driver control circuit 12 has the same configuration as the IVC control circuit 14 of the embodiment 4 described for FIG. 13.

Then, operations of the embodiment 6 are described below by referring to waveform diagrams shown in FIGS. 18(*a*) to 18(*f*).

When H-level clocks RAS, CAS, and WE are input to the input protection circuits 161, 162, and 163 respectively through the clock terminal 3a (enable state) (refer to FIG. 18(*a*)), the input circuits 164, 165, and 166 set outputs to L-level. In this case, the first NAND circuit 167 and second NAND circuit 168 invert their L-level signals into H-levels and output the H-level signals and the inverter 169 inverts an H-level input received from the second NAND 168 into L-level and outputs the L-level signal to the driver control circuit 12 as a disable signal (refer to FIG. 18(*b*)). When an L-level disable signal is input (enable state), the driver control circuit 12 generates an L-level driver control signal (refer to FIG. 18(*c*)) and outputs the signal to Pch-Tr 13a and Nch-Tr 13b of the internal-power-source driver circuit 13. In this case, Nch-Tr 13b is turned off and Pch-Tr 13a is turned on, and the circuit 12 supplies the external-power-source voltage VCC to the peripheral circuit 21, memory cell 22, and internal voltage circuit 23 as the internal-power-source voltage IVC (refer to FIGS. 18(*d*) and 18(*e*)).

Moreover, when clocks CAS and WE are inverted into L-level while the clock RAS is kept H-level (disable state) (refer to FIG. 18(*a*)), the input circuit 164 keeps an output (L-level) but the input circuits 165 and 166 set outputs to H-level. In this case, the first NAND circuit 167 sets an output to H-level, the second NAND circuit 168 inverts an H-level output into L-level and outputs the L-level output, and the inverter 169 inverts an L-level input supplied from the second NAND 168 into H-level, waveform-shapes the H-level input, and outputs the waveform-shaped input to the driver control circuit 12 as a disable signal (refer to FIG. 18(*b*)). When an H-level disable signal is input (disable state), the driver control circuit 12 generates an H-level driver control signal (refer to FIG. 18(*c*)) and outputs the signal to Pch-Tr 13a and Nch-Tr 13b of the internal-power-source driver circuit 13. In this case, Pch-Tr 13a is turned off and Nch-Tr 13b is turned on to set the internal-power-source voltage VCC to the GND level (VSS) (refer to FIGS. 18(*d*) and 18(*e*)).

As described above, the embodiment 6 is provided with:
the timing detection circuit 16 for outputting an L-level disable signal when levels of time-division clocks (RAS, CAS, and WE) input through the clock terminal 3a are kept H-level (enable state) and inverts the disable signal into H-level when CAS and WE become L-level (disable state) while RAS is kept H-level;
the driver control circuit 12 for outputting an L-level driver control signal when an L-level disable signal is input and outputting an H-level driver control signal when an H-level disable signal is input; and
the internal-power-source driver circuit 13 for supplying the external-power-source voltage VCC to the peripheral circuit 21, memory cell 22, and internal voltage circuit 23 as the internal-power-source voltage IVC when an L-level driver control signal is input and setting the internal-power-source voltage IVC to the GND level (VSS) when an H-level driver control signal is input. Therefore, it is possible to reduce a standby current under the disable state without adding an external signal like the case of the embodiment 1 or applying a high-voltage clock to the clock terminal 3a like the case of the embodiment 5.

Embodiment 7

Figure 20:
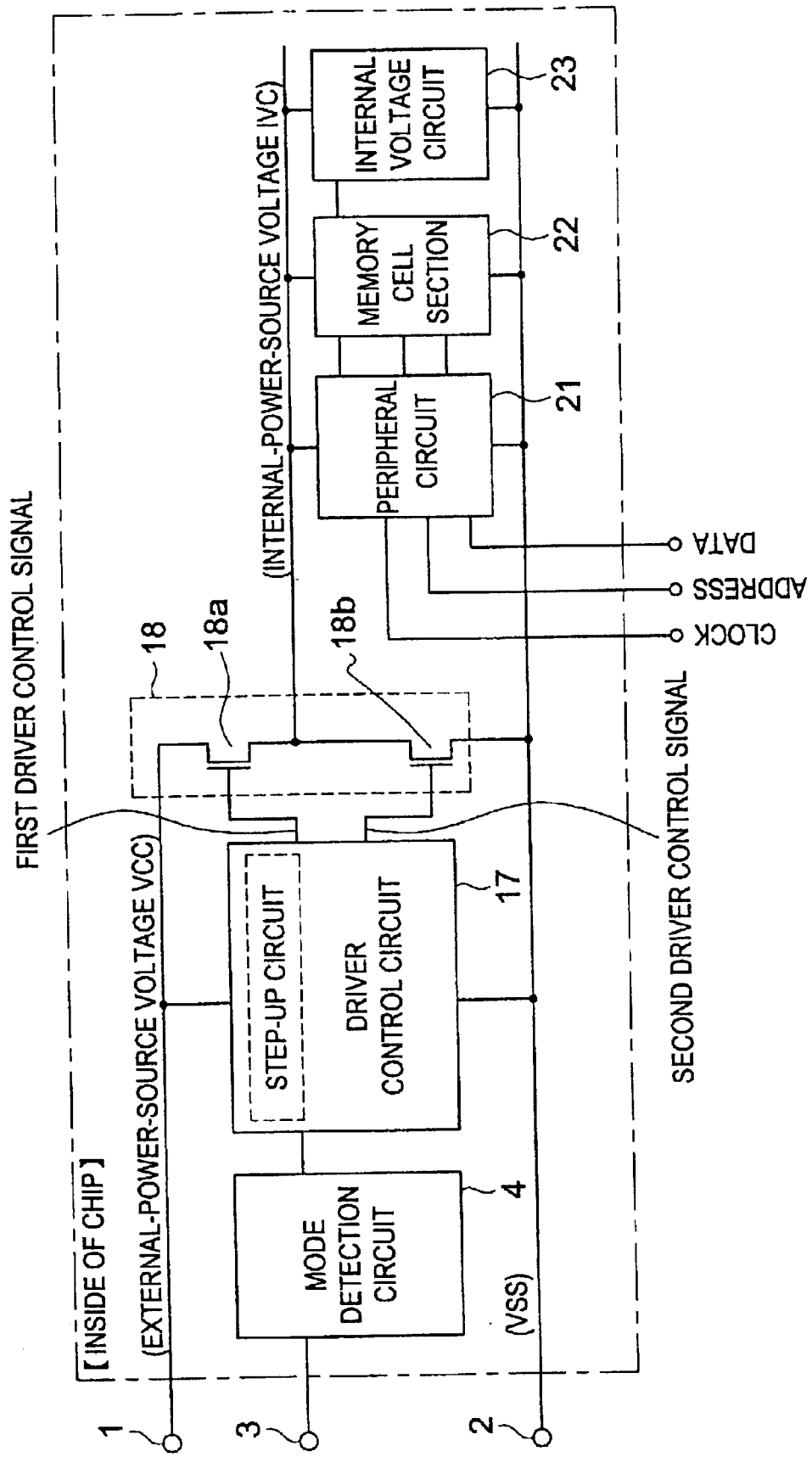
FIG. 20 is a block diagram showing a configuration of a DRAM power-source controller of embodiment 7 of the present invention.
Figure 21:
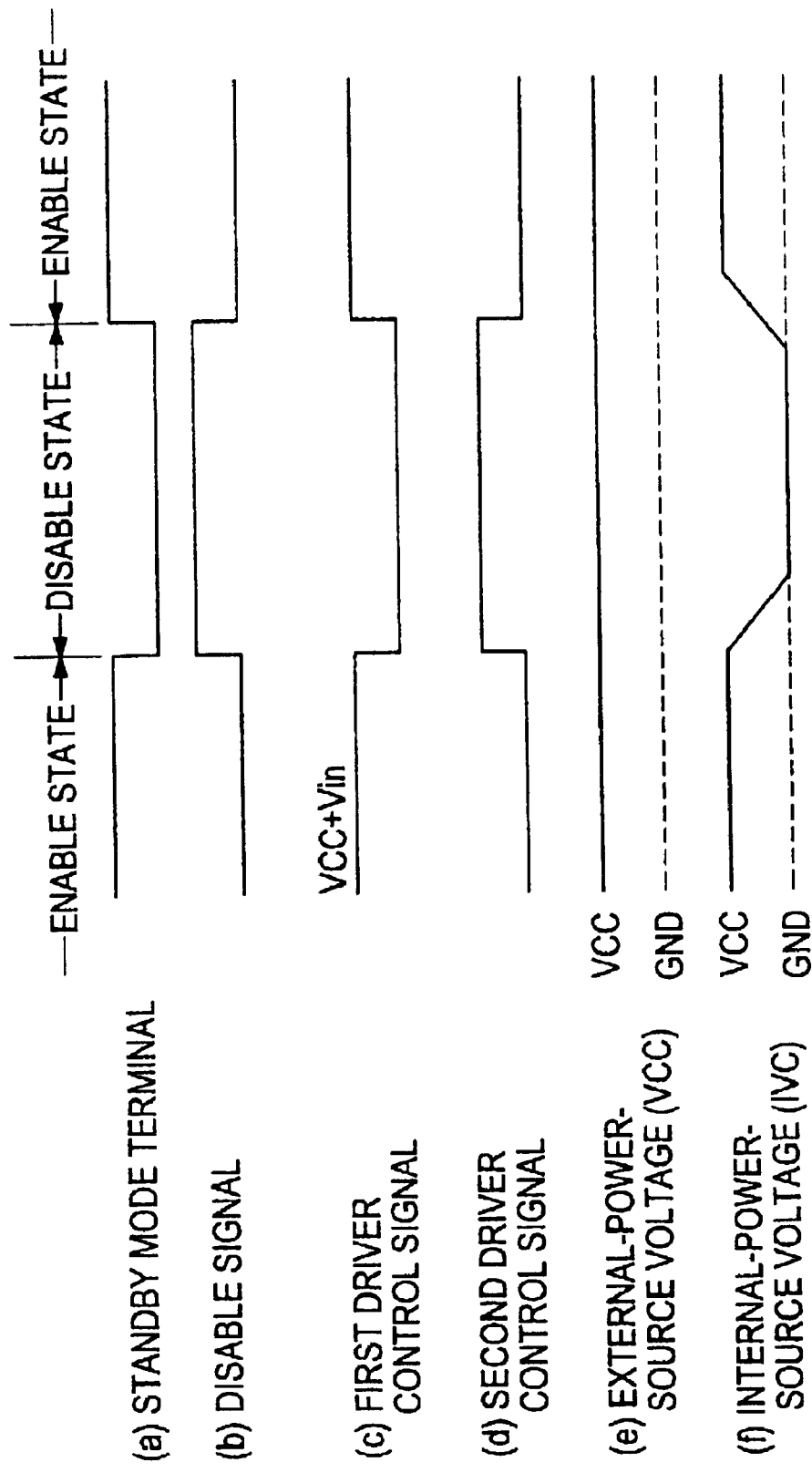
FIGS. 21(a) to 21(f) are waveform diagrams showing operations of a DRAM power-source controller.
Figure 22:
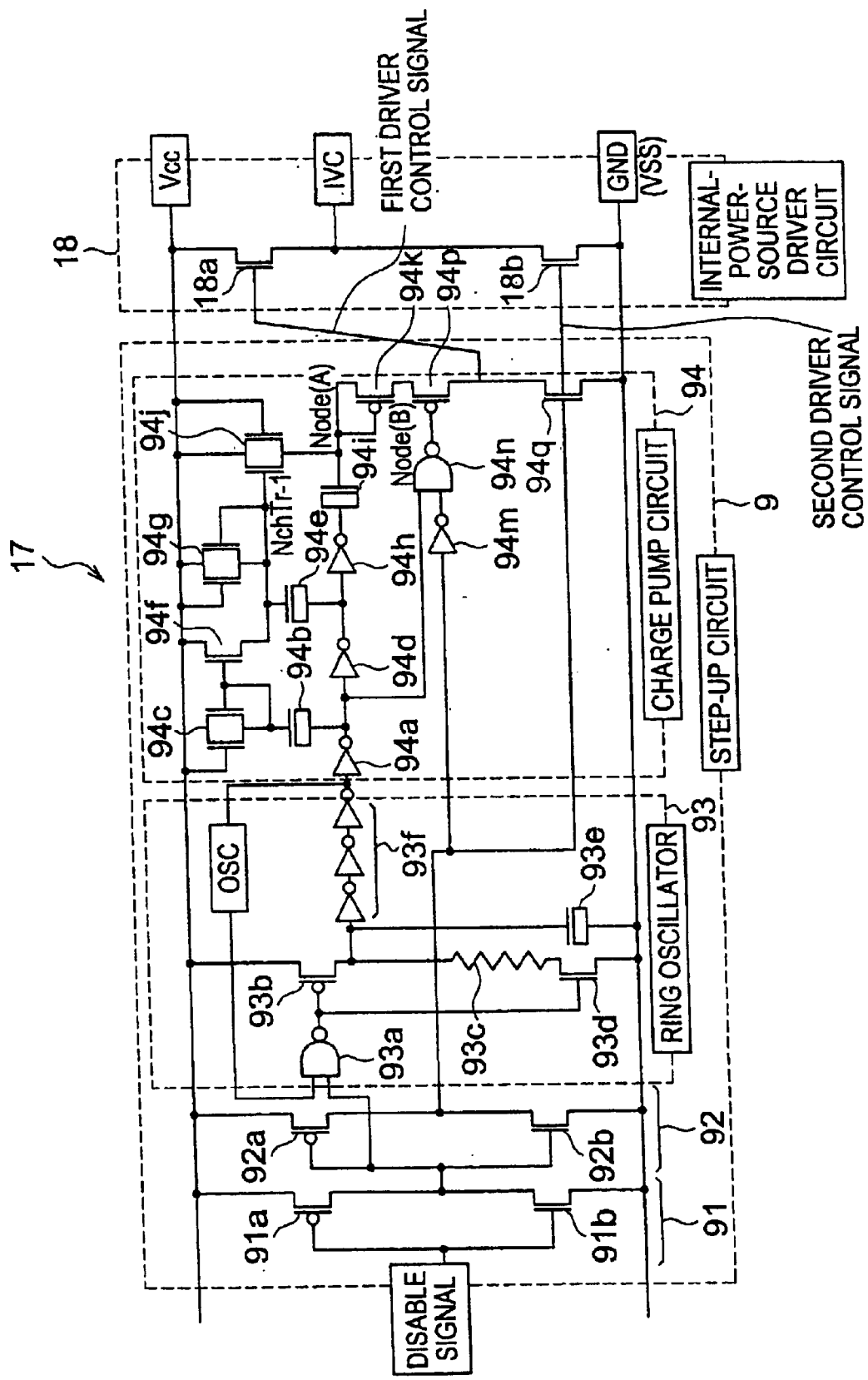
FIG. 22 is an illustration of a driver control circuit and an internal-power-source driver circuit.

FIG. 20 is a block diagram showing a configuration of the DRAM power-source controller of the embodiment 7 of the present invention;

FIGS. 21(*a*) to 21(*f*) are waveform diagrams showing operations of a DRAM power-source controller; and FIG. 22 is an illustration of a driver control circuit and internal-power-source driver circuit.

A portion same as or corresponding to the portion of the embodiments 1 and 2 described for FIGS. 1, 3 and 7 is provided with the same symbol and its description is omitted.

The DRAM power-source controller shown in FIG. 20 is constituted by the mode detection circuit 4, the driver control circuit 17 for outputting an H-level first driver control signal and an L-level second driver control signal when a disable signal output from the mode detection circuit 4 is kept L-level (enable state) and converting the H-level first driver control signal into L-level and the L-level second driver control signal into H-level when the disable signal is kept H-level (disable state), and the internal-power-source driver circuit 18 for supplying the external-power-source voltage VCC to the peripheral circuit 21, memory cell 22, and internal voltage circuit 23 as the internal-power-source voltage IVC because Nch-Tr 18a is turned on and Nch-Tr 18b is turned off under the enable state and setting the internal-power-source voltage IVC to the GND level because Nch-Tr 18a is turned off and Nch-Tr 18b is turned on under the disable state.

The above-described driver control circuit 17 is constituted by a step-up circuit 9 provided with the first and second inverters 91 and 92, ring oscillator 93, and charge pump circuit 94 as shown in FIG. 17. Moreover, as described for the embodiment 2, when an L-level disable signal is input, the level of a first driver control signal is set to H-level (VCC+Vtn+α) by the ring oscillator 93 and charge pump circuit 94 and an H-level output of the second inverter 92 is output as a second driver control signal. When an H-level disable signal is input, an OSC signal of the ring oscillator 93 becomes H-level. Therefore, Pch-Tr 94p of the charge pump circuit 94 is turned off, the first driver control signal becomes L-level, and an L-level output of the second inverter 92 is output as the second driver control signal.

The internal-power-source driver circuit 18 is constituted by Nch-Tr 18a whose drain is connected to the external-power-source voltage VCC, whose gate is connected to the connection point between Pch-Tr 94p and Nch-Tr 94q of the charge pump circuit 94, and whose source is connected to the internal-power-source voltage IVC and Nch-Tr 18b whose drain is connected to the internal-power-source voltage IVC, whose gate is connected to the output side of the second inverter 92, and whose source is connected to the GND (VSS).

Then, operations of the embodiment 7 are described below by referring to waveform diagrams shown in FIGS. 21(a) to 21(f).

When the standby mode terminal 3 is kept H-level (enable state) (refer to FIG. 21(a)), the mode detection circuit 4 outputs an L-level disable signal to the driver control circuit 17 (refer to FIG. 21(b)). When the L-level disable signal is input, the driver control circuit 17 outputs an H-level fist driver control signal stepped up to VCC+Vtn+α by the ring oscillator 93 and step-up circuit 94 and moreover outputs an L-level second driver control signal generated by the first and second inverters 91 and 92 (refer to FIGS. 21(c) and 21(d)). In this case, Nch-Tr 18a of the internal-power-source driver circuit 8 is turned on and Nch-Tr 18b of the circuit 8 is turned off to supply the external-power-source voltage VCC to the peripheral circuit 21, memory cell 22, and internal voltage circuit 23 as the internal-power-source voltage IVC (refer to FIGS. 21(e) and 21(f)).

Moreover, when the standby mode terminal 3 is inverted from H-level into L-level (disable state) (refer to FIG. 21(a)), the mode detection circuit 4 outputs an H-level disable signal to the driver control circuit 17 (refer to FIG. 21(b)). When the H-level disable signal is input, the OSC signal of the ring oscillator 93 becomes H-level and Pch-Tr 94p of the charge pump circuit 94 is turned off and thereby, the driver control circuit 17 inverts a first driver control signal into L-level and outputs an H-level output of the second inverter 92 as a second driver control signal (refer to FIGS. 21(c) and 21(d)). In this case, Nch-Tr 18a of the internal-power-source driver circuit 8 is turned off and Nch-Tr 18b of the circuit 8 is turned on to set the internal-power-source voltage IVC to the GND level (refer to FIGS. 21(e) and 21(f)).

As described above, the embodiment 7 is provided with:
the mode detection circuit 4;
the driver control circuit 17 for outputting an H-level first driver control signal and an L-level second driver control signal when a disable signal output from the mode detection circuit 4 is kept L-level (enable state), inverting the first driver control signal into L-level and the second driver control signal into H-level when the disable signal is kept H-level (disable state); and
the internal-power-source driver circuit 18 for supplying the external-power-source voltage VCC to the peripheral circuit 21, memory cell 22, and internal voltage circuit 23 as the internal-power-source voltage IVC because Nch-Tr 18a is turned on and Nch-Tr 18b is turned off under the enable state and setting the internal-power-source voltage IVC to the GND level because Nch-Tr 18a is turned off and Nch-Tr 18b is turned on under the disable state. Therefore, it is possible to reduce the standby current under the disable state without fluctuating the voltage of the external-power-source voltage VCC. Moreover, because the internal-power-source driver circuit 8 uses Nch-Tr, the mobility and response speed are accelerated. Therefore, it is possible to decrease the internal-power-source driver circuit 8 in size and pattern area.

Figure 23:
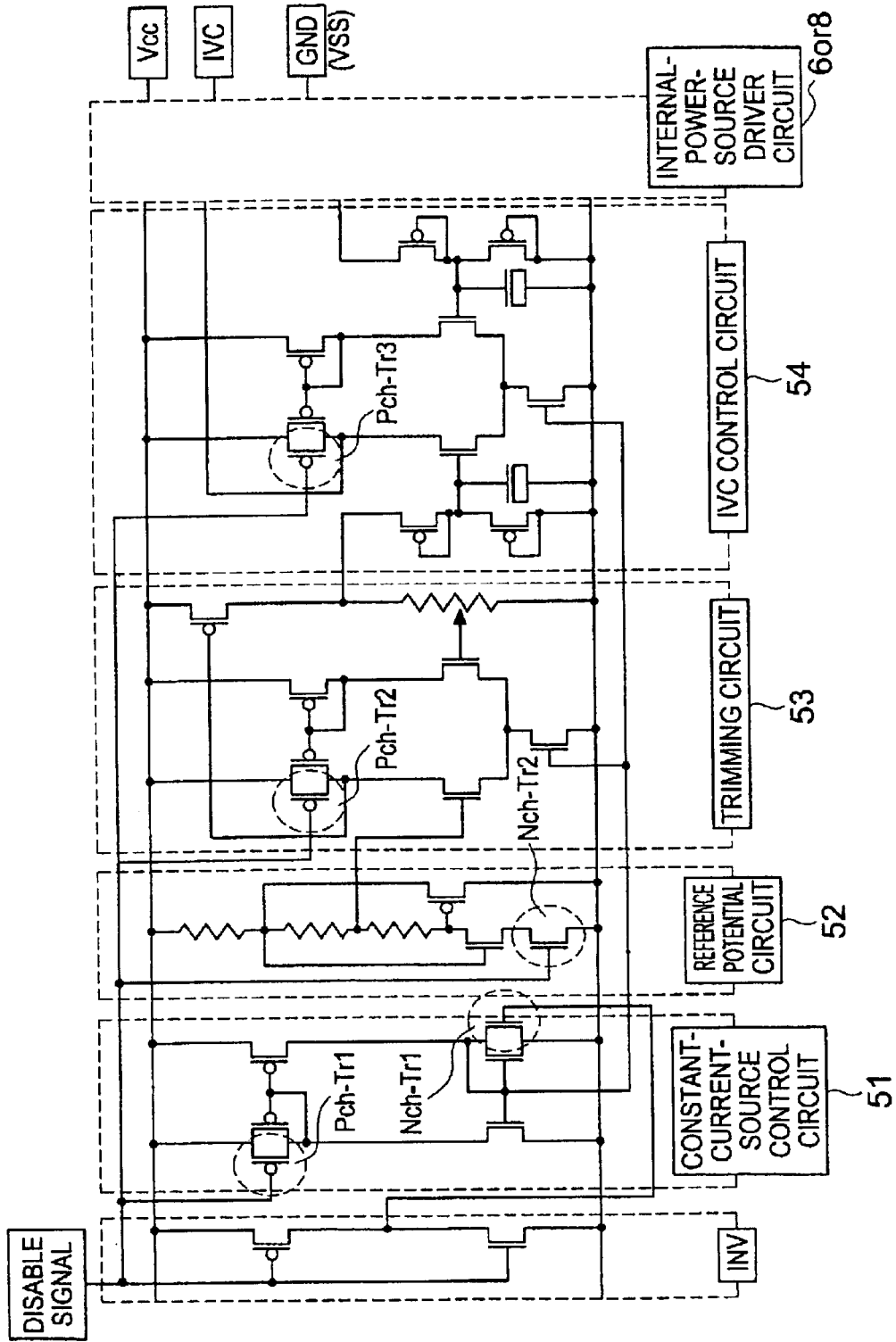
FIG. 23 is an illustration of an internal reference-power-source circuit showing modifications of embodiments 1 and 2.

It is also allowed to apply the circuit configuration shown in FIG. 23 to the circuits (constant-current-source control circuit 51, reference potential circuit 52, trimming circuit 53, and IVC control circuit 54) for controlling the level of a second driver control signal in the internal-power-source reference circuit 5 of the embodiment 1 described for FIG. 4. Moreover, it is allowed to apply the circuit configuration shown in FIG. 23 to the circuits for controlling the level of a second driver control signal in the internal-power-source reference circuit 7 of the embodiment 2 described for FIG. 7.

The circuit shown in FIG. 23 is constituted by setting an inverter for inputting a disable signal to the front stage of the constant-current-source control circuit 51, setting Pch-Tr 1 for gate-inputting the disable signal and Nch-Tr 1 for gate-inputting an output of the inverter to the constant-current-source control circuit 51, setting the Nch-Tr 2 of the reference potential circuit 52 so as to input the disable signal instead of the external-power-source voltage VCC, and adding Pch-Tr 2 for gate-inputting the disable signal to the differential amplifier 53a of the trimming circuit 53 and Pch-Tr 3 for gate-inputting the disable signal to the differential amplifier 54a of the IVC control circuit 54.

Operations of the above circuit when used for the embodiment 1 are described below.

When a disable signal output from the mode detection circuit 4 becomes L-level (enable state), Pch-Tr 6b of the internal-power-source driver circuit 6 is turned on in accordance with an L-level first driver control signal by the first and second inverters 55 and 56 to supply the external-power-source voltage VCC as the internal-power-source voltage IVC the same as the case of the embodiment 1. Moreover, Pch-Tr 1 and Nch-Tr 1 of the constant-current-source control circuit 51, Pch-Tr 2 of the trimming circuit 53, and Pch-Tr 3 of the IVC control circuit 54 as shown in FIG. 23 are turned on and Nch-Tr 2 of the reference potential circuit 52 is turned off. Therefore, the constant-current-source control circuit 51, reference potential circuit 52, trimming circuit 53, and IVC control circuit 54 are all inactivated. In this case, because Pch-Tr 3 of the IVC control circuit 54 is turned on, the second driver control signal becomes H-level and Pch-Tr 6*a* of the internal-power-source driver circuit 6 is turned off.

When the disable signal is inverted into H-level (disable state), the first driver control signal is inverted into H-level to turn off Pch-Tr 6*b* of the internal-power-source driver circuit 6. In this case, because Pch-Tr 1, Nch-Tr 1, Pch-Tr 2, and Pch-Tr 3 shown in FIG. 23 are turned off and Nch-Tr 2 is turned on, the constant-current-source control circuit 51, reference potential circuit 52, trimming circuit 53, and IVC control circuit 54 are all activated, the second driver control signal is inverted into L-level to turn on Pch-Tr 6*a* of the internal-power-source driver circuit 6 the same as the case of the embodiment 1.

Moreover, operations of the above circuit when used for the embodiment 2 are described below.

When a disable signal output from the mode detection circuit 4 becomes L-level (enable state), Pch-Tr 8*b* of the internal-power-source driver circuit 8 is turned on in accordance with an H-level first driver control signal stepped up by the step-up circuit 9 of the internal-power-source driver circuit 8 to supply the external-power-source voltage VCC as the internal-power-source voltage IVC the same as the case of the embodiment 2. Moreover, the Pch-Tr 1 and Nch-Tr 1 of the constant-current-source control circuit 51, Pch-Tr 2 of the trimming circuit 53, and Pch-Tr 3 of the IVC control circuit 54 shown in FIG. 23 are turned on and Nch-Tr 2 of the reference potential circuit 52 is turned off. Therefore, the constant-current-source control circuit 51, reference potential circuit 52, trimming circuit 53, and IVC control circuit 54 are all inactivated. In this case, because Pch-Tr 3 of the IVC control circuit 54 is turned on, the second driver control signal becomes H-level and Pch-Tr 8*a* of the internal-power-source driver circuit 8 is turned off.

When the disable signal is inverted into H-level (disable state), the first driver control signal is inverted into L-level and Pch-Tr 8*b* of the internal-power-source driver circuit 8 is turned off. In this case, Pch-Tr 1, Nch-Tr 1, Pch-Tr 2, and Pch-Tr 3 shown in FIG. 23 are turned off and Nch-Tr 2 shown in FIG. 23 is turned on. Therefore, the constant-current-source control circuit 51, reference potential circuit 52, trimming circuit 53, and IVC control circuit 54 are all activated, the second driver control signal is inverted into L-level to turn on Pch-Tr 8*a* of the internal-power-source driver circuit 8 the same as the case of the embodiment 2.

What is claimed is:

1. A DRAM power-source controller comprising a power-source-voltage controller that supplies a voltage of an external power source as that of an internal power source to a peripheral circuit, a memory cell and an internal voltage circuit upon detection of an enable state of a DRAM, and that supplies a voltage lower than that of the external power source as the internal power source to the peripheral circuit, the memory cell and the internal voltage circuit upon detection of a disable state of the DRAM.

2. A DRAM power-source controller comprising a power-source-voltage controller that supplies a voltage of an external power source as that of an internal power source to a peripheral circuit, a memory cell and an internal voltage circuit upon detection of an enable state of a DRAM and that sets the internal power source to a ground level upon detection of a disable state of the DRAM.

3. A DRAM power-source controller comprising:
a power-source-voltage controller that supplies a voltage of an external power source as that of an internal power source to a peripheral circuit, a memory cell and an internal voltage circuit upon detection of an enable state of a DRAM, and that supplies a voltage lower than that of the external power source as the internal power source to the peripheral circuit, the memory cell and the internal voltage circuit upon detection of a disable state of the DRAM, wherein
the power-source-voltage controller includes an internal-power-source driver circuit having a switching device, a mode detection circuit for outputting an L-level mode signal upon detection of the enable state of the DRAM through an input terminal and inverting the mode signal into an H-level upon detection of the disable state of the DRAM through the input terminal, and an internal-power-source reference circuit for controlling the switching device of the internal-power-source driver circuit so that the internal power source has a voltage equal to the voltage of the external power source when the mode signal output from the mode detection circuit is kept at the L-level and controlling the switching device of the internal-power-source driver circuit so that the internal power source has the voltage lower than that of the external power source when the mode signal output from the mode detection circuit is inverted to the H-level.

4. The DRAM power-source controller according to claim 3, wherein the internal-power-source driver circuit includes a pair of P-channel transistors connected together in parallel between the external power source and the internal power source, and
the internal-power-source reference circuit controls one of the P-channel transistors when the mode signal output from the mode detection circuit is at the L-level so that the internal power source has a voltage lower than the voltage of the external power source, and controls another one of the P-channel transistors when the mode signal output from the mode detection circuit is inverted to the H-level to generate a voltage lower than that of the internal power source.

5. The DRAM power-source controller according to claim 3, wherein the internal-power-source driver circuit includes a pair of P-channel transistors connected together in parallel between the external power source and the internal power source.

6. The DRAM power-source controller according to claim 3, wherein the internal-power-source driver circuit includes a pair of P-channel transistors connected together in parallel between the external power source and the internal power source, and
the internal-power-source reference circuit turns on one of the P-channel transistors when the mode signal output from the mode detection circuit is at the L-level so that the internal power source has a voltage equal to that of the external power source, and controls another one of the P-channel transistors when the mode signal output from the mode detection circuit is inverted to the H-level so that the internal power source has the voltage lower than that of the external power source.

7. The DRAM power-source controller according to claim 3, wherein the internal-power-source driver circuit includes N-channel and P-channel transistors connected together in parallel between the external power source and the internal power source.

8. The DRAM power-source controller according to claim 3, wherein the internal-power-source driver circuit includes N-channel and P-channel transistors connected together in parallel between the external power source and the internal power source, and the internal-power-source reference circuit applies a voltage equal to or higher than the voltage of the external power source to the N-channel transistor when the mode signal output from the mode detection circuit is at the L-level so that the internal power source has a voltage equal to the voltage of the external power source, and controls the P-channel transistor when the mode signal output from the mode detection circuit is inverted to the H-level so that the internal power source has the voltage lower than the voltage of the external power source.

9. A DRAM-power-source controller comprising:

a power-source-voltage controller that supplies a voltage of an external power source as that of an internal power source upon detection of an enable state of a DRAM, and that sets the internal power source to a ground level upon detection of a disable state of the DRAM, wherein the power-source-voltage controller includes an internal-power-source driver circuit having a switching device, a mode detection circuit for outputting an L-level mode signal upon detection of the enable state of the DRAM through an input terminal and inverting the mode signal into an H-level upon detection of the disable state of the DRAM through the input terminal, and a driver control circuit for controlling the switching device of the internal-power-source driver circuit so that the internal power source has a voltage equal to the voltage of the external power source when the mode signal output from the mode detection circuit is at the L-level and controlling the switching device of the internal-power-source driver circuit so that the internal power source is set to the ground level when the mode signal output from the mode detection circuit is inverted to the H-level.

10. The DRAM power-source controller according to claim 9, wherein the internal-power-source driver circuit includes P-channel and N-channel transistors connected together in series between the external power source and the ground level.

11. The DRAM power-source controller according to claim 9, wherein the internal-power-source driver circuit is constituted by P-channel and N-channel transistors connected together in series between the external power source and the ground level, and the driver control circuit turns on the P-channel transistor when the mode signal output from the mode detection circuit is at the L-level so that the internal power source has a voltage equal to the voltage of the external power source, and turns on the N-channel transistor when the mode signal output from the mode detection circuit is inverted to the H-level to set the internal power source to the ground level.

12. The DRAM power-source controller according to claim 9, wherein the internal-power-source driver circuit includes first and second N-channel transistors connected together in series between the external power source and the ground level.

13. The DRAM power-source controller according to claim 12, wherein the driver control circuit generates a signal having a level equal to or higher than a level of the external power source when the mode signal output from the mode detection circuit is at the L-level to turn on the first N-channel transistor so that the internal power source has a voltage equal to the voltage of the external power source and turns on the second N-channel transistor when the mode signal output from the mode detection circuit is inverted to the H-level to set the internal power source to the ground level.

14. A DRAM power-source controller comprising:

a power-source-voltage controller that supplies a voltage of an external power source as that of an internal power source upon detection of an enable state of a DRAM, and that sets the internal power source to a ground level upon detection of a disable state of the DRAM, wherein the power-source-voltage controller includes an internal-power-source driver circuit having a switching device, a supervoltage circuit which determines that the DRAM is in the enable state when a clock is input thereto and a level of the clock is lower than a preset threshold value to generate an L-level mode signal and determines that the DRAM is in the disable state when the level of the clock is equal to or higher than the threshold value to invert the mode signal into an H-level, and a driver control circuit for controlling the switching device of the internal-power-source driver circuit so that the internal power source has a voltage equal to the voltage of the external power source when the mode signal output from the supervoltage circuit is at the L-level and controlling the switching device of the internal-power-source driver circuit so that the internal power source is set to the ground level when the mode signal output from the supervoltage circuit is inverted to the H-level.

15. The DRAM power-source controller according to claim 14, wherein the internal-power-source driver circuit includes P-channel and N-channel transistors connected together in series between the external power source and the ground level.

16. The DRAM power-source controller according to claim 14, wherein the internal-power-source driver circuit includes P-channel and N-channel transistors connected together in series between the external power source and the ground level, and the driver control circuit turns on the P-channel transistor when the mode signal output from the supervoltage circuit is at the L-level so that the internal power source has a voltage equal to the voltage of the external power source and turns on the N-channel transistor when the mode signal output from the supervoltage circuit is inverted to the H-level to set the internal power source to the ground level.

17. A DRAM power-source controller comprising:

a power-source-voltage controller that supplies a voltage of an external power source as that of an internal power source upon detection of an enable state of a DRAM, and that sets the internal power source to a ground level upon detection of a disable state of the DRAM, wherein the power-source-voltage controller includes an internal-power-source driver circuit having a switching device, a timing detection circuit which determines the enable state when time-divided RAS, CAS, and WE clocks are input and levels of each clock is at an H-level to generate an L-level mode signal and determines the disable state when the RAS clock is at the H-level and the CAS and WE clocks are at an L-level to invert the mode signal to the H-level, and a driver control circuit for controlling the switching device of the internal-power-source driver circuit so that the internal power source has a voltage equal to the voltage of the external power source when the mode signal output from the timing detection circuit is at the L-level and controlling the switching device of the internal-power-source driver circuit so that the internal power source is set to the ground level when the mode signal output from the timing detection circuit is inverted to the H-level.

18. The DRAM power-source controller according to claim 17, wherein the internal-power-source driver circuit includes P-channel and N-channel transistors connected together in series between the external power source and the ground level.

19. The DRAM power-source controller according to claim 17, wherein the driver control circuit turns on the P-channel transistor when the mode signal output from the timing detection circuit is at the L-level so that the internal power source has a voltage equal to the voltage of the external power source and turns on the N-channel transistor when the mode signal output from the timing detection circuit is inverted to the H-level to set the internal power source to the ground level.

* * * * *